US012615743B2

(12) United States Patent
Ahn et al.

(10) Patent No.:  US 12,615,743 B2
(45) Date of Patent:  Apr. 28, 2026

(54) ELECTRONIC DEVICE COMPRISING THERMAL MANAGEMENT CHAMBER USING BOILING

(71) Applicant: Samsung Electronics Co., Ltd., Suwon-si (KR)

(72) Inventors: Joseph Ahn, Suwon-si (KR); Kyungha Koo, Suwon-si (KR); Hongki Moon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 290 days.

(21) Appl. No.: 18/461,141

(22) Filed: Sep. 5, 2023

(65) Prior Publication Data

US 2023/0413484 A1     Dec. 21, 2023

Related U.S. Application Data

(63) Continuation of application No. PCT/KR2022/003926, filed on Mar. 22, 2022.

(30) Foreign Application Priority Data

Apr. 5, 2021     (KR) ........................ 10-2021-0043820

(51) Int. Cl.
*H05K 7/20*         (2006.01)
*G06F 1/20*         (2006.01)
*H04M 1/02*        (2006.01)

(52) U.S. Cl.
CPC ......... *H05K 7/20336* (2013.01); *G06F 1/203* (2013.01); *H04M 1/0266* (2013.01); *H05K 7/2099* (2013.01); *G06F 2200/201* (2013.01)

(58) Field of Classification Search
CPC ............... H01L 23/427; H01L 21/4878; H01L 21/4882; H01L 2225/06589; H01L 23/367;

(Continued)

(56) References Cited

U.S. PATENT DOCUMENTS 8,587,945 B1 *  11/2013  Hartmann ............... H01L 23/42
                                                                     361/720
9,147,633 B2      9/2015  Eid et al.
                    (Continued)

FOREIGN PATENT DOCUMENTS

JP        2008147482 A      6/2008
JP        2009069230 A      4/2009
                    (Continued)

OTHER PUBLICATIONS

Yuki et al., Hydrophilic Coating of Copper Particle Monolayer Wicks for Enhanced Passive Water Transport, Online Article: https://www.mdpi.com/1996-1073/13/12/3294, Published Jun. 26, 2020, 10 pages, Energies.

(Continued)

*Primary Examiner* — Michael A Matey
(74) *Attorney, Agent, or Firm* — Nixon & Vanderhye P.C.

(57)                  ABSTRACT

An electronic device according to various embodiments comprises: a housing including a heat source and a thermal management chamber thermally coupled to the heat source; and a display disposed on the housing on the opposite side from the heat source. The thermal management chamber includes a working fluid, and is configured to generate bubbles in the working fluid at or above the boiling critical temperature of the working fluid. The thermal management chamber may include: a first wall located adjacent to the heat source and having a first hydrophilic surface; a second wall located on the opposite side from the first wall and spaced apart from the heat source, and having a second hydrophobic surface, and a plurality of third walls located between the first wall and the second wall.

19 Claims, 20 Drawing Sheets

(58) Field of Classification Search

CPC ............ H01L 23/3672; H05K 7/20336; H05K 7/2029; H05K 7/20309; H05K 7/20318; H05K 7/20263; H05K 7/20281; H05K 7/20327; H05K 7/20936; F28D 15/0233; F28D 15/04; F28D 15/046; F28D 15/0275; F28D 15/025; F28D 15/0266; F28D 15/0283; F28D 15/06; F28F 2245/02; F28F 13/182; F28F 21/089; F28F 2225/04; F28F 2255/20; F28F 2260/00; F28F 2260/02; F28C 3/02; F28C 3/04; G06F 1/20; G06F 1/203; G06F 2200/201; G06F 1/1637

See application file for complete search history.

(56) References Cited

U.S. PATENT DOCUMENTS

| | | | | |
|---|---|---|---|---|
| 2007/0230128 | A1 | 10/2007 | Kim et al. | |
| 2008/0236795 | A1* | 10/2008 | You | H01L 23/427 165/104.21 |
| 2010/0018678 | A1 | 1/2010 | Siu | |
| 2014/0247556 | A1* | 9/2014 | Eid | H01L 23/3675 29/592.1 |
| 2016/0033212 | A1 | 2/2016 | Wang et al. | |
| 2017/0092561 | A1* | 3/2017 | Eid | H01L 21/4878 |
| 2017/0160017 | A1* | 6/2017 | Macdonald | F28F 21/067 |
| 2017/0328648 | A1* | 11/2017 | Dede | F28D 15/0233 |
| 2018/0320984 | A1* | 11/2018 | Lewis | F28D 15/04 |
| 2018/0356156 | A1* | 12/2018 | Hurbi | F28F 13/182 |
| 2019/0014688 | A1* | 1/2019 | Weibel | B23P 15/26 |
| 2019/0116691 | A1* | 4/2019 | Bozorgi | H01L 23/427 |
| 2019/0343017 | A1* | 11/2019 | Eid | H01L 24/17 |
| 2020/0103175 | A1* | 4/2020 | Ben-Menahem | F28D 15/046 |
| 2021/0043544 | A1 | 2/2021 | Eid et al. | |
| 2023/0019481 | A1* | 1/2023 | Jin | H05K 7/20336 |
| 2024/0310128 | A1* | 9/2024 | Haj-Hariri | F28F 13/187 |

FOREIGN PATENT DOCUMENTS

| | | |
|---|---|---|
| JP | 3170057 U | 8/2011 |
| JP | 2014192346 A | 10/2014 |
| JP | 6353682 B2 | 6/2018 |
| KR | 101934847 B1 | 1/2019 |
| KR | 20190084781 A | 7/2019 |

OTHER PUBLICATIONS

International Search Report for PCT/KR2022/003926 mailed Jul. 6, 2022, 4 pages.

Written Opinion of the ISA for PCT/KR2022/003926 mailed Jul. 6, 2022, 4 pages.

Extended European Search Report dated Jul. 12, 2024 issued in European Patent Application No. 22784812.4.

* cited by examiner

ELECTRONIC DEVICE COMPRISING THERMAL MANAGEMENT CHAMBER USING BOILING

CROSS-REFERENCE TO RELATED APPLICATIONS

This application is a continuation of International Application No. PCT/KR2022/003926 designating the United States, filed on Mar. 22, 2022, in the Korean Intellectual Property Receiving Office and claiming priority to Korean Patent Application No. 10-2021-0043820, filed on Apr. 5, 2021, in the Korean Intellectual Property Office, the disclosures of each of which are incorporated by reference herein in their entireties.

BACKGROUND

Field

The disclosure relates to an electronic device, and for example, to an electronic device including a thermal management chamber using boiling.

Description of Related Art

There is a growing demand for high integration and high performance as electronic devices have been downsized and thinner and the latest technology has been applied thereto, and the heat density of electronic devices is increasing. Accordingly, a heat diffusion structure is in development to improve the thermal conductivity and heat dissipation performance of an electronic device. For example, as the heat diffusion structure, there is a heat diffusion device that operates at room temperature using the capillarity and evaporation principles.

Boiling refers to a phenomenon in which liquid boils in a pool that is at rest and remains stationary. A boiling-based heat transfer may include natural convection, a phase change occurring by transient heat conduction of a heated surface of a liquid, micro-layer evaporation, and transient micro-convection. Among these, the transient micro-convection may occur in the wake of a movement (e.g., bubble-driven turbulent flow and convection) of bubbles escaping from the surface.

In addition, a convective heat transfer in nucleate boiling may include free convection, forced convection that is intensified around a nucleation site by a movement of bubbles by the growth of the bubbles, and convection intensified by filling (e.g., a movement by a pressure), with a bulk liquid, a space that is empty as bubbles depart from a heating portion. Nucleate boiling is a type of boiling that occurs when a heat flux is less than a critical heat flux (CHF) although the surface temperature is higher than a saturated fluid temperature by a certain value. For example, in the case of water, nucleate boiling occurs when a temperature on the surface is higher than a saturation temperature by about 10° C. to 30° C. At a nucleation site, isolated bubbles are formed and are detached from the surface, inducing significant fluid mixing near the surface, thereby substantially increasing a convective heat transfer coefficient and a heat flux. The effect of nucleate boiling may be exhibited at a liquid-wall interface and at a bubble-liquid interface. When a maximum heat flux exceeds a CHF, dry-out may occur due to a vapor film formed on a heated surface, which may drastically reduce the heat transfer efficiency and may cause local overheating of the heated surface.

A boiling-based thermal management method is different from an evaporation-based thermal management method. The evaporation-based thermal management method may operate at room temperature and use only latent heat, and employ a wick structure using a capillary force, whereas the boiling-based thermal management method may operate at a boiling point and use latent heat and convection and may have a simple structure without a wick. In addition, in the case of evaporation, dry-out may occur considerably, a liquid may evaporate within a specified temperature range, and the temperature of the liquid may decrease during evaporation due to the use of a liquid surface-oriented mechanism. In contrast, in the case of boiling, dry-out may occur relatively less, boiling may occur only at a specific temperature, and the temperature of the liquid may be maintained during boiling due to the use of entire liquid mechanism. In addition, in terms of processability, using the boiling principle may be more effective than using the evaporation principle. However, unlike evaporation, which occurs when a space above a liquid is unsaturated, boiling occurs when the internal pressure of the liquid and the external pressure of the liquid are substantially the same.

SUMMARY

Embodiments of the disclosure provide an electronic device including a thermal management structure that effectively manages heat of the electronic device and maintains a uniform temperature distribution of the electronic device.

According to various example embodiments, an electronic device may include: a housing including a heat source and a thermal management chamber thermally coupled to the heat source; and a display disposed on the housing opposite the heat source. The thermal management chamber may contain a working fluid and be configured to generate bubbles in the working fluid at or above a critical boiling temperature of the working fluid. The thermal management chamber may include: a first wall disposed adjacent to the heat source and having a hydrophilic first surface; a second wall disposed opposite the first wall spaced apart from the heat source and having a hydrophobic second surface; and a plurality of third walls disposed between the first wall and the second wall.

According to various example embodiments, an electronic device may include: a housing including a main body, a heat source, a thermal management chamber thermally coupled to the heat source and detachably coupled to the main body; and a display disposed on the main body opposite the heat source, wherein the thermal management chamber may include: a first wall disposed adjacent to the heat source and having a hydrophilic first surface; a second wall disposed opposite the first wall spaced apart from the heat source and having a hydrophobic second surface; and a plurality of third walls disposed between the first wall and the second wall. The plurality of third walls may be seamlessly formed with the main body, and the housing may further include a first junction connecting the first wall and the plurality of third walls.

According to various example embodiments, an electronic device may include: a housing including a main body, a heat source, a thermal management chamber thermally coupled to the heat source and detachably coupled to the main body; and a display disposed on the main body opposite the heat source, wherein the thermal management chamber may include: a first wall disposed adjacent to the heat source and having a hydrophilic first surface; a second wall disposed opposite the first wall spaced apart from the heat source and having a hydrophobic second surface; and a plurality of third walls disposed between the first wall and the second wall. The second wall and the plurality of third walls may be seamlessly formed, and the housing may further include a first junction connecting the first wall and at least a portion of the plurality of third walls and a second junction connecting the main body and at least a portion of the plurality of third walls.

According to various example embodiments of the present disclosure, as thermal resistance in a thermal management structure may be improved and heat dissipation in an electronic device may be improved, the electronic device may be suitable for higher heat and/or power consumption and may have improved manufacturability and applicability of the thermal management structure.

In addition, various effects directly or indirectly ascertained through the present disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIGS. 17 and 18 are graphs showing heat flux and critical heat flux (CHF) performance of a first surface of a first wall of a thermal management chamber, in which FIG. 17 is a graph of CHF and FIG. 18 is a graph of a nucleate boiling heat flux range in the graph of FIG. 17 according to various example embodiments.

DETAILED DESCRIPTION

Figure 1:
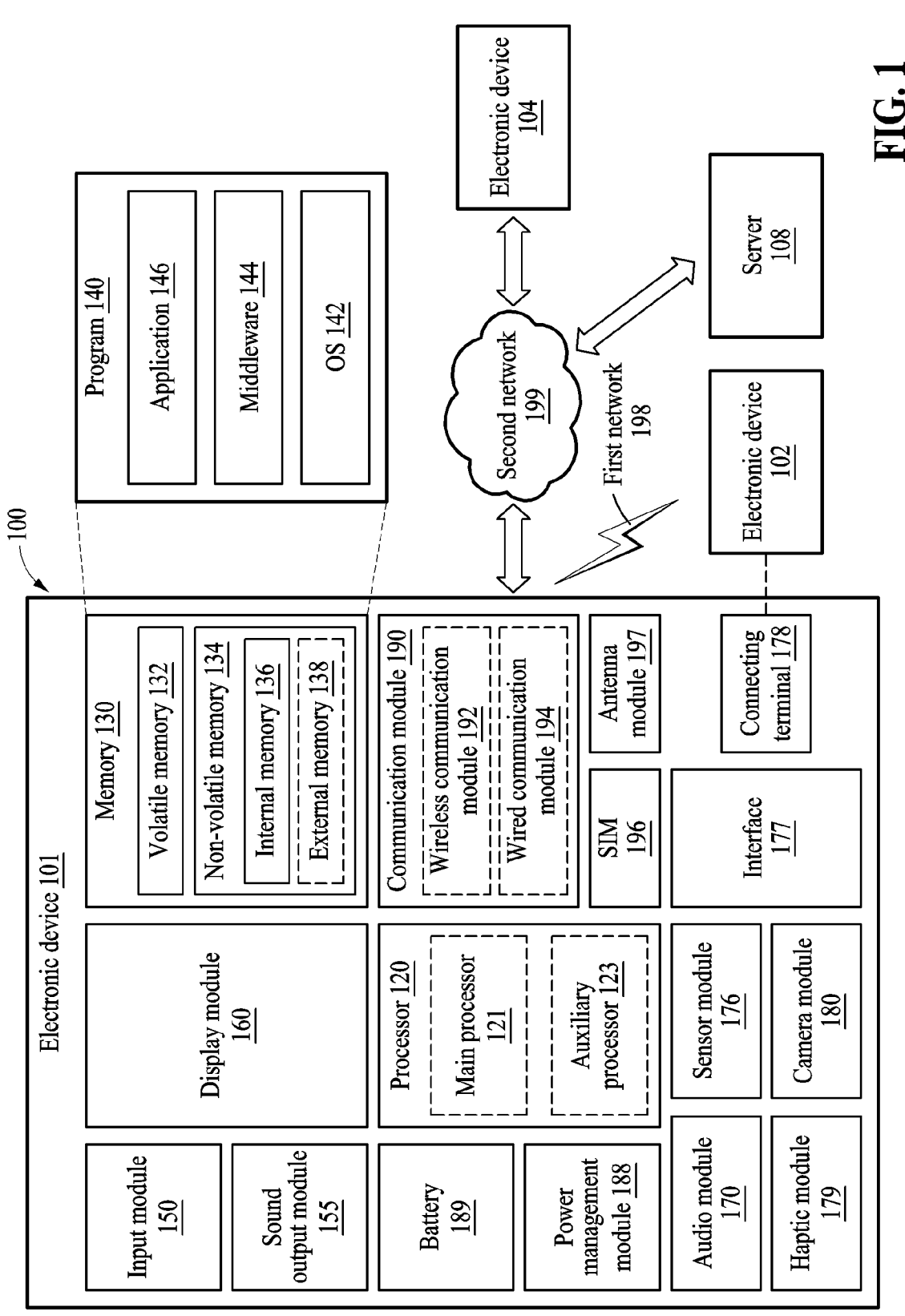
FIG. 1 is a block diagram illustrating an example electronic device in a network environment according to various example embodiments.

Referring to FIG. 1, an electronic device 101 in a network environment 100 may communicate with an electronic device 102 via a first network 198 (e.g., a short-range wireless communication network), or communicate with at least one of an electronic device 104 and a server 108 via a second network 199 (e.g., a long-range wireless communication network). The electronic device 101 may communicate with the electronic device 104 via the server 108. The electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one (e.g., the connecting terminal 178) of the above components may be omitted from the electronic device 101, or one or more other components may be added to the electronic device 101. In various embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or data stored in the volatile memory 132, and store resulting data in a non-volatile memory 134. The processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently from or in conjunction with, the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). The auxiliary processor 123 (e.g., an ISP or a CP) may be implemented as a portion of another component (e.g., the camera module 180 or the communication module 190) that is functionally related to the auxiliary processor 123. The auxiliary processor 123 (e.g., an NPU) may include a hardware structure specifically for artificial intelligence (AI) model processing. An AI model may be generated by machine learning. The learning may be performed by, for example, the electronic device 101, in which the AI model is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may alternatively or additionally include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. The receiver may be implemented separately from the speaker or as a part of the speaker.

The display module 160 may visually provide information to the outside (e.g., a user) of the electronic device 101. The display module 160 may include, for example, a display, a hologram device, or a projector, and a control circuitry to control its corresponding one of the displays, the hologram device, and the projector. The display module 160 may include a touch sensor adapted to sense a touch, or a pressure sensor adapted to measure an intensity of a force of the touch.

The audio module 170 may convert sound into an electric signal or vice versa. The audio module 170 may obtain the sound via the input module 150 or output the sound via the sound output module 155 or an external electronic device (e.g., the electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electric signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used by the electronic device 101 to couple with an external electronic device (e.g., the electronic device 102) directly (e.g., by wire) or wirelessly. The interface 177 may include, for example, a high-definition multimedia interface (HDMI), a universal serial bus (USB) interface, a secure digital (SD) card interface, or an audio interface.

The connecting terminal 178 may include a connector via which the electronic device 101 may physically connect to an external electronic device (e.g., the electronic device 102). The connecting terminal 178 may include, for example, an HDMI connector, a USB connector, an SD card connector, or an audio connector (e.g., a headphones connector).

The haptic module 179 may convert an electric signal into a mechanical stimulus (e.g., a vibration or a movement) or an electrical stimulus, which may be recognized by a user via their tactile sensation or kinesthetic sensation. The haptic module 179 may include, for example, a motor, a piezo-electric element, or an electric stimulator.

The camera module 180 may capture a still image and moving images. The camera module 180 may include one or more lenses, image sensors, ISPs, and flashes.

The power management module 188 may manage power supplied to the electronic device 101. The power management module 188 may be implemented as, for example, at least a part of a power management integrated circuit (PMIC).

The battery 189 may supply power to at least one component of the electronic device 101. The battery 189 may include, for example, a primary cell, which is not rechargeable, a secondary cell, which is rechargeable, or a fuel cell.

The communication module 190 may support establishing a direct (e.g., wired) communication channel or a wireless communication channel between the electronic device 101 and an external electronic device (e.g., the electronic device 102, the electronic device 104, or the server 108) and performing communication via the established communication channel. The communication module 190 may include one or more CPs that are operable independently from the processor 120 (e.g., an AP) and that support direct (e.g., wired) communication or wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device, for example, the electronic device 104, via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5$^{th}$ generation (5G) network, a next-generation communication network, the Internet, or a computer network (e.g., an LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4$^{th}$ generation (4G) network, and a next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., an mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large-scale antenna. The wireless communication module 192 may support various requirements specified in the electronic device 101, an external electronic device (e.g., the electronic device 104), or a network system (e.g., the second network 199). The wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form an mmWave antenna module. The mmWave antenna module may include a PCB, an RFIC on a first surface (e.g., a bottom surface) of the PCB or adjacent to the first surface of the PCB and capable of supporting a designated high-frequency band (e.g., a mmWave band), and a plurality of antennas (e.g., an antenna array) disposed on a second surface (e.g., a top or a side surface) of the PCB, or adjacent to the second surface of the PCB and capable of transmitting or receiving signals in the designated high-frequency band.

At least some of the above-described components may be coupled mutually and exchange signals (e.g., commands or data) therebetween via an inter-peripheral communication scheme (e.g., a bus, general-purpose input and output (GPIO), serial peripheral interface (SPI), or mobile industry processor interface (MIPI)).

According to an example embodiment, commands or data may be transmitted or received between the electronic device 101 and the external electronic device (e.g., the electronic device 104) via the server 108 coupled with the second network 199. Each of the external electronic devices (e.g., the electronic device 102 or 104) may be a device of the same type as or a different type from the electronic device 101. All or some of operations to be executed by the electronic device 101 may be executed by one or more of the external electronic devices (e.g., the electronic devices 102 and 104 and the server 108). For example, if the electronic device 101 needs to perform a function or a service automatically, or in response to a request from a user or another device, the electronic device 101, instead of, or in addition to, executing the function or service, may request one or more external electronic devices to perform at least a part of the function or service. The one or more external electronic devices receiving the request may perform the at least part of the function or the service requested, or an additional function or an additional service related to the request and may transfer a result of the performance to the electronic device 101. The electronic device 101 may provide the result, with or without further processing of the result, as at least part of a response to the request. To that end, cloud computing, distributed computing, mobile edge computing (MEC), or client-server computing technology may be used, for example. The electronic device 101 may provide ultra-low latency services using, e.g., distributed computing or MEC. According to an embodiment, the external electronic device (e.g., the electronic device 104) may include an Internet-of-things (IoT) device. The server 108 may be an intelligent server using machine learning and/or a neural network. The external electronic device (e.g., the electronic device 104) or the server 108 may be included in the second network 199. The electronic device 101 may be applied to intelligent services (e.g., a smart home, a smart city, a smart car, or healthcare) based on 5G communication technology or IoT-related technology.

According to various example embodiments described herein, an electronic device may be a device of one of various types. The electronic device may include, as non-limiting examples, a portable communication device (e.g., a smartphone), a computing device, a portable multimedia device, a portable medical device, a camera, a wearable device, a home appliance, or the like. However, the electronic device is not limited to the foregoing examples.

It is to be understood that various example embodiments of the disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things unless the relevant context clearly indicates otherwise. As used herein, "A or B," "at least one of A and B," "at least one of A or B," "A, B, or C," "at least one of A, B, and C," and "at least one of A, B, or C," each of which may include any one of the items listed together in the corresponding one of the phrases, or all possible combinations thereof. Terms such as "1st" and "2nd" or "first" and "second" may simply be used to distinguish the component from other components in question, and do not limit the components in other aspects (e.g., importance or order). It is to be understood that if an element (e.g., a first element) is referred to, with or without the term "operatively" or "communicatively," as "coupled with," "coupled to," "connected with," or "connected to" another element (e.g., a second element), the element may be coupled with the other element directly (e.g., by wire), wirelessly, or via a third element.

As used in connection with various example embodiments of the disclosure, the term "module" may include a unit implemented in hardware, software, or firmware, or any combination thereof, and may interchangeably be used with other terms, for example, "logic," "logic block," "part," or "circuitry." A module may be a single integral component, or a minimum unit or part thereof, adapted to perform one or more functions. For example, according to an example embodiment, the module may be implemented in the form of an application-specific integrated circuit (ASIC).

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
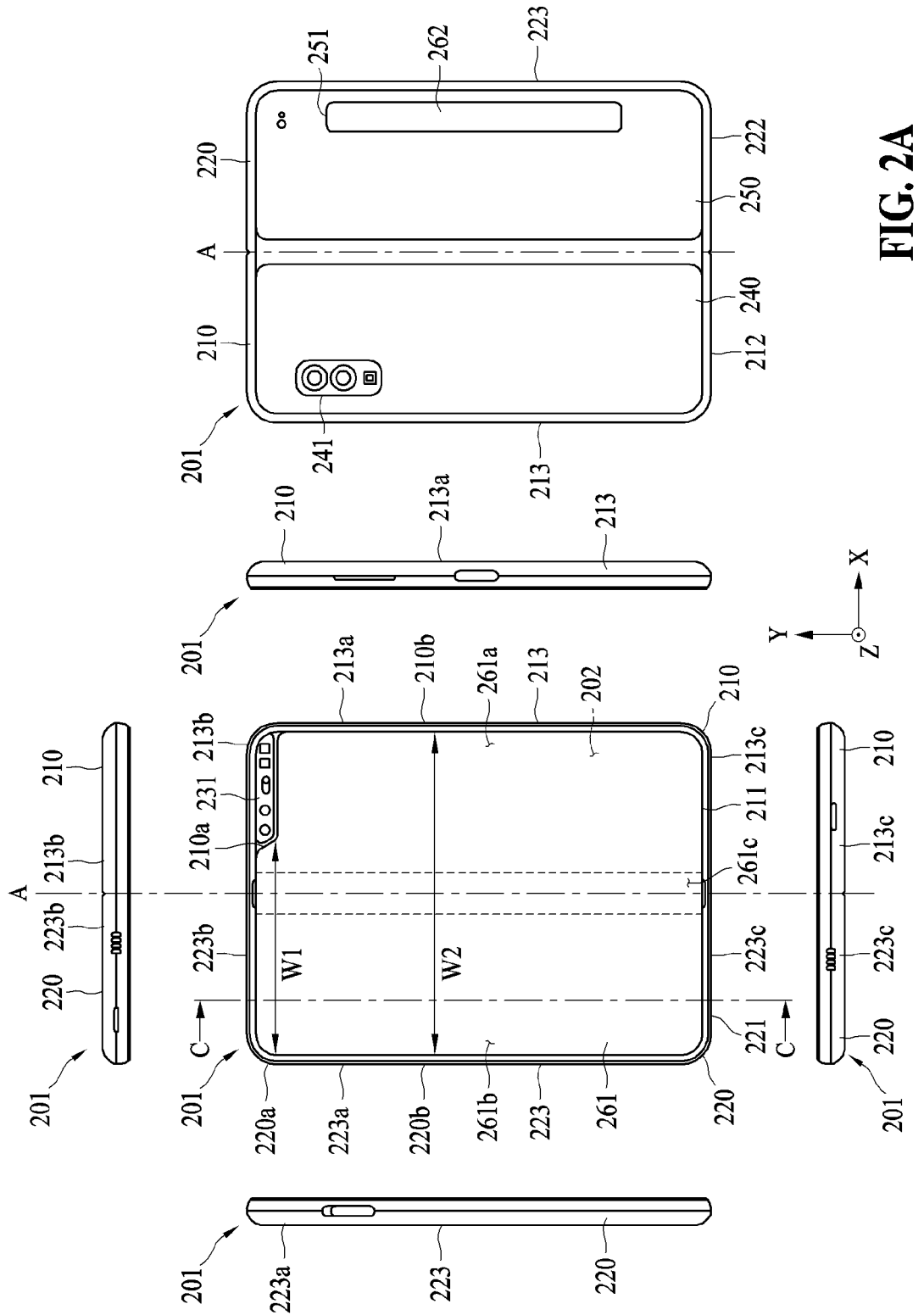
FIG. 2A is a diagram illustrating an example foldable electronic device in an unfolded state according to various example embodiments.
Figure 2B:
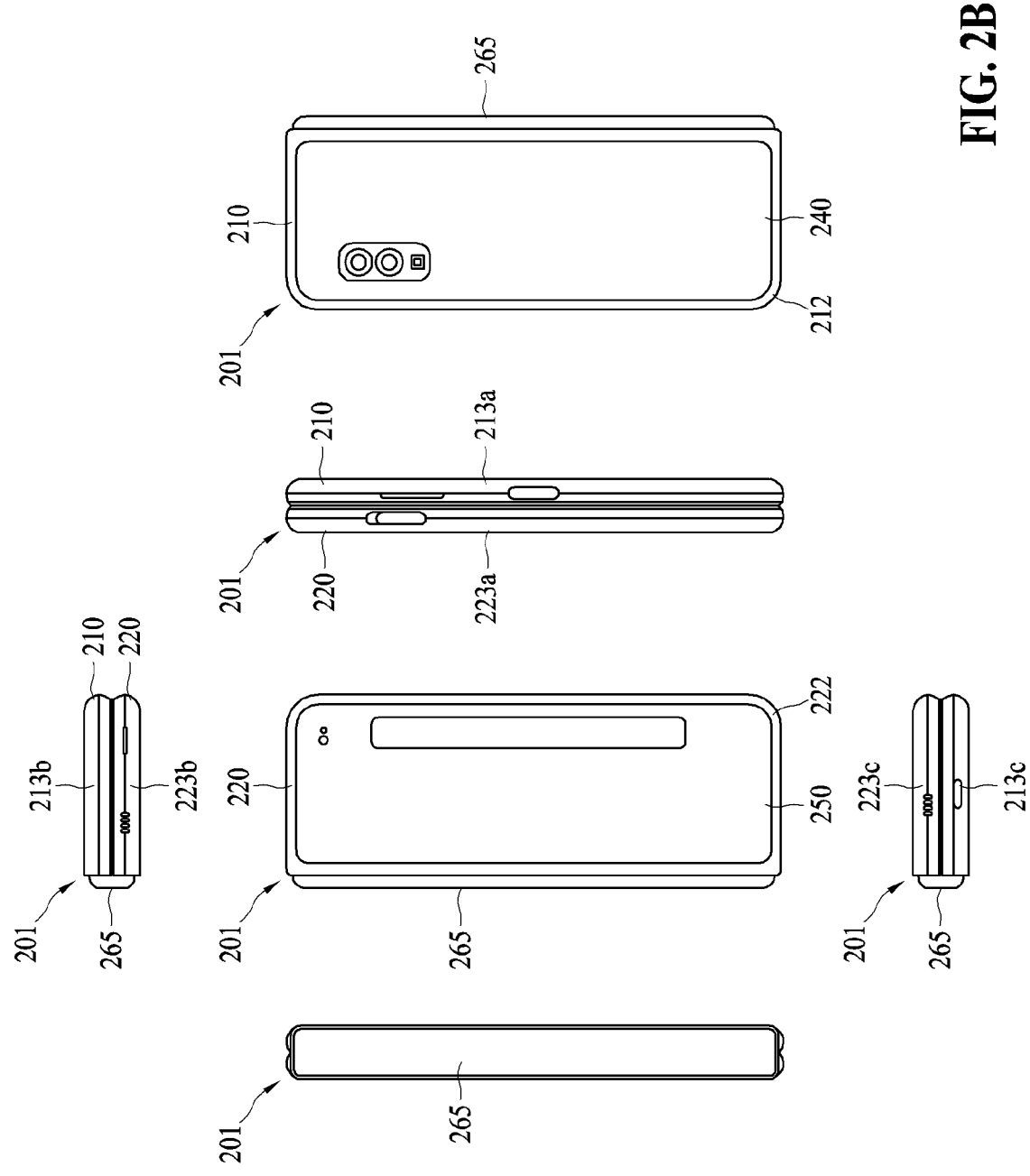
FIG. 2B is a diagram illustrating an example foldable electronic device in a folded state according to various example embodiments.

Referring to FIGS. 2A and 2B, a foldable electronic device 201 may include a pair of housings 210 and 220 rotatably coupled to each other through a hinge structure to be folded with respect to each other, a hinge cover 265 for covering foldable portions of the pair of housings 210 and 220, and a display 261 (e.g., a flexible display or a foldable display) disposed in a space formed by the pair of housings 210 and 220. In the present disclosure, a surface on which the display 261 is disposed may be defined as a front surface of the foldable electronic device 201, and a surface opposite to the front surface may be defined as a rear surface of the foldable electronic device 201. In addition, a surface surrounding a space between the front surface and the rear surface may be defined as a side surface of the foldable electronic device 201.

In an example embodiment, the pair of housings 210 and 220 may include a first housing 210 including a sensor area 231, a second housing 220, a first rear cover 240, and a second rear cover 250. The pair of housings 210 and 220 of the electronic device 201 are not limited to the shapes or the combination and/or coupling of components shown in FIGS. 2A and 2B, and may be implemented in other shapes or by another combination and/or coupling of components.

In an example embodiment, the first housing 210 and the second housing 220 may be arranged on both sides with respect to a folding axis A and may be substantially symmetrical to the folding axis A. In an example embodiment, an angle or distance between the first housing 210 and the second housing 220 may vary depending on whether the electronic device 201 is in an unfolded state, a folded state, or an intermediate state. In an example embodiment, unlike the second housing 220, the first housing 210 may include the sensor area 231 in which various sensor modules (e.g., the sensor module 176 of FIG. 1) are disposed, and the first housing 210 and the second housing 220 may have shapes symmetrical to each other in areas other than the sensor area 231. In an example embodiment, the sensor area 231 may be disposed in at least an area of the second housing 220. In an example embodiment, the sensor area 231 may be replaced with at least a partial area of the second housing 220. The sensor area 231 may include, for example, a camera hole area, a sensor hole area, an under-display camera (UDC) area, and/or an under-display sensor (UDS) area.

In an example embodiment, the first housing 210 may be connected to a hinge structure in the unfolded state of the electronic device 201. The first housing 210 may include a first surface 211 facing the front surface of the electronic device 201, a second surface 212 facing a direction opposite to the first surface 211, and a first side portion 213 surrounding at least a portion of a space between the first surface 211 and the second surface 212. The first side portion 213 may include a first side surface 213a disposed substantially in parallel to the folding axis A, a second side surface 213b extending in a direction substantially perpendicular to the folding axis A from one end of the first side surface 213a, and a third side surface 213c extending in a direction substantially perpendicular to the folding axis A from another end of the first side surface 213a and substantially parallel to the second side surface 213b. The second housing 220 may be connected to the hinge structure in the unfolded state of the electronic device 201. The second housing 220 may include a third surface 221 facing the front surface of the electronic device 201, a fourth surface 222 facing a direction opposite to the third surface 221, and a second side portion 223 surrounding at least a portion of a space between the third surface 221 and the fourth surface 222. The second side portion 223 may include a fourth side surface 223a disposed substantially in parallel to the folding axis A, a fifth side surface 223b extending in a direction substantially perpendicular to the folding axis A from one end of the fourth side surface 223a, and a sixth side surface 223c extending in a direction substantially perpendicular to the folding axis A from another end of the fourth side surface 223a and substantially parallel to the fifth side surface 223b.

The first surface 211 and the third surface 221 may face each other when the electronic device 201 is in the folded state.

In an example embodiment, the electronic device 201 may include a recessed accommodating portion 202 for accommodating the display 261 through the structural coupling of the first housing 210 and the second housing 220. The accommodating portion 202 may have substantially the same size as the display 261. In an example embodiment, due to the sensor area 231, the accommodating portion 202 may have at least two different widths in a direction perpendicular to the folding axis A. For example, the accommodating portion 202 may have a first width W1 between a first portion 210a formed at the edge of the sensor area 231 of the first housing 210 and a second portion 220a parallel to the folding axis A of the second housing 220, and a second width W2 between a third portion 210b parallel to the folding axis A without overlapping the sensor area 231 of the first housing 210 and a fourth part 220b of the second housing 220. Here, the second width W2 may be greater than the first width W1. That is, the accommodating portion 202 may be formed to have the first width W1 from the first portion 210a of the first housing 210 to the second portion 220a of the second housing 220 having a mutually asymmetrical shape and to have the second width W2 from the third portion 210b of the first housing 210 to the fourth portion 220b of the second housing 220. The first portion 210a and the third portion 210b of the first housing 210 may be formed at different distances from the folding axis A. However, the width of the accommodating portion 202 may not be limited to the foregoing example. For example, the accommodating portion 202 may have three or more different widths due to the shape of the sensor area 231 or the asymmetrical shape of the first housing 210 and the second housing 220.

In an example embodiment, at least a portion of the first housing 210 and the second housing 220 may be formed of a metal material or a non-metal material having a predetermined magnitude of rigidity appropriate to support the display 261.

In an example embodiment, the sensor area 231 may be formed adjacent to one corner of the first housing 210. However, the arrangement, shape, and size of the sensor area 231 are not limited to the shown example. In an example embodiment, the sensor area 231 may be formed at another corner of the first housing 210 or in a predetermined area of an upper corner and a lower corner. In an example embodiment, the sensor area 231 may be disposed in at least an area of the second housing 220. In an example embodiment, the sensor area 231 may be formed in a shape extending between the first housing 210 and the second housing 220.

In an example embodiment, the electronic device 201 may include at least one component disposed to be exposed on the front surface of the electronic device 201 through the sensor area 231 or at least one opening formed in the sensor area 231. For example, the component may include at least one of a front camera module, a receiver, a proximity sensor, an illuminance sensor, an iris recognition sensor, an ultrasonic sensor, or an indicator.

In an example embodiment, the first rear cover 240 may be disposed on the second surface 212 of the first housing 210 and may have substantially rectangular edges. At least a portion of the edges of the first rear cover 240 may be surrounded by the first housing 210. The second rear cover 250 may be disposed on the fourth surface 222 of the second housing 220 and may have substantially rectangular edges. At least a portion of the edges of the second rear cover 250 may be surrounded by the second housing 220.

In an example embodiment, the first rear cover 240 and the second rear cover 250 may have substantially symmetrical shapes with respect to the folding axis A. In an example embodiment, the first rear cover 240 and the second rear cover 250 may have different shapes. In an example embodiment, the first housing 210 and the first rear cover 240 may be integrally formed, and the second housing 220 and the second rear cover 250 may be integrally formed.

In an example embodiment, the first housing 210, the second housing 220, the first rear cover 240, and the second rear cover 250 may provide a space in which various components (e.g., a PCB, the antenna module 197 of FIG. 1, the sensor module 176 of FIG. 1, or the battery 189 of FIG. 1) of the electronic device 201 may be arranged through a structure in which the first housing 210, the second housing 220, the first rear cover 240, and the second rear cover 250 are coupled to one another. In an example embodiment, at least one component may be visually exposed on the rear surface of the electronic device 201. For example, at least one component may be visually exposed through a first rear area 241 of the first rear cover 240. In this example, the component may include a proximity sensor, a rear camera module, and/or a flash. In an example embodiment, at least a portion of a sub-display 262 may be visually exposed through a second rear area 251 of the second rear cover 250. In an example embodiment, the electronic device 201 may include a sound output module (e.g., the sound output module 155 of FIG. 1) disposed through at least a partial area of the second rear cover 250.

In an example embodiment, the display 261 may be disposed in the accommodating portion 202 formed by the pair of housings 210 and 220. For example, the display 261 may be arranged to occupy substantially most of the front surface of the electronic device 201. The front surface of the electronic device 201 may include an area in which the display 261 is disposed, and a partial area (e.g., an edge area) of the first housing 210 and a partial area (e.g., an edge area) of the second housing 220, which are adjacent to the display 261. The rear surface of the electronic device 201 may include the first rear cover 240, a partial area (e.g., an edge area) of the first housing 210 adjacent to the first rear cover 240, the second rear cover 250, and a partial area (e.g., an edge area) of the second housing 220 adjacent to the second rear cover 250. In an example embodiment, the display 261 may be a display in which at least one area is deformable into a planar surface or a curved surface. In an example embodiment, the display 261 may include a folding area 261c, a first area 261a on a first side (e.g., a right side) of the folding area 261c, and a second area 261b on a second side (e.g., a left side) of the folding area 261c. For example, the first area 261a may be disposed in the first surface 211 of the first housing 210, and the second area 261b may be disposed in the third surface 221 of the second housing 220. However, such an area division of the display 261 is provided only as an example, and the display 261 may be divided into a plurality of areas depending on the structure or functions of the display 261. For example, as shown in FIG. 2A, the display 261 may be divided into areas based on the folding axis A or the folding area 261c extending in parallel to a Y-axis, or the display 261 may be divided into areas based on another folding area (e.g., a folding area extending in parallel to an X-axis) or another folding axis (e.g., a folding axis parallel to the X-axis). This area division of the display 261 is only a physical division based on the pair of housings 210 and 220 and the hinge structure, and the display 261 may display substantially one screen through the pair of housings 210 and 220 and the hinge structure. In an example embodiment, the first area 261a may include a notch area formed along the sensor area 231, but the other areas of the first area 231 may be substantially symmetrical to the second area 261b. In an example embodiment, the first area 261a and the second area 261b may have substantially symmetrical shapes with respect to the folding area 261c.

In an example embodiment, the hinge cover 265 may be disposed between the first housing 210 and the second housing 220 and configured to cover the hinge structure. The hinge cover 265 may be hidden by at least a portion of the first housing 210 and the second housing 220 or exposed to the outside according to the operating state of the electronic device 201. For example, when the electronic device 201 is in the unfolded state as shown in FIG. 2A, the hinge cover 265 may be hidden by the first housing 210 and the second housing 220 not to be exposed to the outside, and when the electronic device 201 is in the folded state as shown in FIG. 2B, the hinge cover 265 may be exposed to the outside between the first housing 210 and the second housing 220. In addition, when the electronic device 201 is in the intermediate state in which the first housing 210 and the second housing 220 form an angle with each other, at least a portion of the hinge cover 265 may be exposed to the outside between the first housing 210 and the second housing 220. In this case, an area of the hinge cover 265 exposed to the outside may be smaller than an area of the hinge cover 265 exposed when the electronic device 201 is in the folded state. In an example embodiment, the hinge cover 265 may have a curved surface.

Regarding the operation of the electronic device 201, when the electronic device 201 is in the unfolded state (e.g., the state of the electronic device 201 of FIG. 2A), the first housing 210 and the second housing 220 may form a first angle (e.g., about 180 degrees (°)) with each other, and the first area 261a and the second area 261b of the display 261 may be oriented in substantially the same direction. The folding area 261c of the display 261 may be on substantially the same plane as the first area 261a and the second area 261b. In an example embodiment, when the electronic device 201 is in the unfolded state, the first housing 210 may rotate at a second angle (e.g., about 360°) relative to the second housing 220, whereby the first housing 210 and the second housing 220 may be reversely folded such that the second surface 212 and the fourth surface 222 may face each other. In addition, when the electronic device 201 is in the folded state (e.g., the state of the electronic device 201 of FIG. 2B), the first housing 210 and the second housing 220 may face each other. The first housing 210 and the second housing 220 may form an angle of about 0° to 10°, and the first area 261a and the second area 261b of the display 261 may face each other. At least a portion of the folding area 261c of the display 261 may be deformed into a curved surface. In addition, when the electronic device 201 is in the intermediate state, the first housing 210 and the second housing 220 may form a predetermined angle with each other. The angle (e.g., a third angle, about 90°) formed by the first area 261a and the second area 261b of the display 261 may be greater than an angle formed when the electronic device 201 is in the folded state and less than an angle formed when the electronic device 201 is in the unfolded state. At least a portion of the folding area 261c of the display 261 may be deformed into a curved surface. In this case, a curvature of the curved surface of the folding area 261c may be smaller than that formed when the electronic device 201 is in the folded state.

Various example embodiments of an electronic device described herein are not limited to a form factor of the electronic device 201 described with reference to FIGS. 2A and 2B and may also apply to electronic devices with various form factors.

Figure 3A:
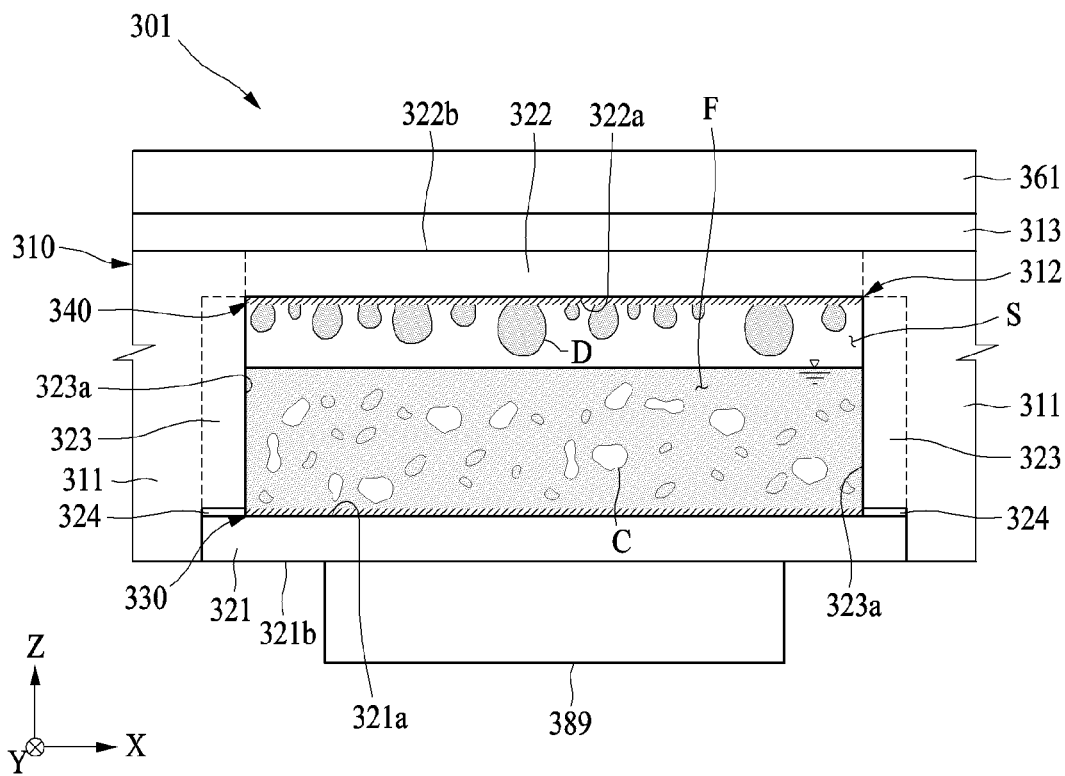
FIG. 3A is a cross-sectional view of a partial area (e.g., a partial area viewed from a line C-C) of an electronic device (e.g., the electronic device of FIG. 2A) according to various example embodiments.

Referring to FIG. 3A, an electronic device 301 (e.g., the electronic device 201) according to an example embodiment may cool the electronic device 301 using a boiling principle and a uniform distribution of temperature of the electronic device 301. The electronic device 301 may include a housing 310 (e.g., the first housing 210 and/or the second housing 220), a display 361 (e.g., the display 261) disposed on one side (e.g., upper side) of the housing 310, and a heat source 389 (e.g., the battery 189) disposed on the other side (e.g., lower side) of the housing 310 or inside the housing 310. The housing 310 may include a main body 311 that supports the display 361, a thermal management chamber 312 that manages heat generated in the electronic device 301 and is thermally coupled to the heat source 389, and an intermediate layer 313 disposed between the main body 311 and the display 361. In an example embodiment, the intermediate layer 313 may be in the form of a sheet. In an example embodiment, the intermediate layer 313 may include graphite.

The thermal management chamber 312 may include a first wall 321 (e.g., a lower wall), a second wall 322 (e.g., an upper wall), and a plurality of third walls 323 (e.g., side walls) disposed between the first wall 321 and the second wall 322. The first wall 321, the second wall 322, and the plurality of third walls 323 may form an inner space S of the thermal management chamber 312.

The first wall 321 may be disposed near the heat source 389. The first wall 321 may have a first inner surface 321a forming at least a portion of the inner space S of the thermal management chamber 312 and a first outer surface 321b opposite the first inner surface 321a. The first inner surface 321a may be hydrophilic. In an example embodiment, the first wall 321 may not include a capillary wick structure.

In an example embodiment, the first wall 321 may have a plate shape. That is, the first wall 321 may extend in a first direction (e.g., an X direction) and in a second direction (e.g., a Y direction) crossing the first direction. The length of the first wall 321 in the first direction and the length thereof in the second direction may be greater than the height of the first wall 321 in a third direction (e.g., a Z direction) crossing the first direction and the second direction, respectively.

In an example embodiment, the first wall 321 may include a microporous structure 330 formed on the first inner surface 321a. The microporous structure 330 may increase a heat exchange area between a working fluid F and the heat source 389 with respect to the first inner surface 311a to improve thermal conductivity of the working fluid F that boils up by a heat transfer from the heat source 389. In an example embodiment, the first wall 321 may have hydrophilicity by other chemical means in addition to a structural modification of the first inner surface 321a. In an example embodiment, the heat source 389 may contact the first outer surface 321b.

In an example embodiment, the first wall 321 may be formed of a first material. The first material may be, for example, copper, aluminum, stainless steel, titanium, and/or other metal materials, or combinations thereof. In an example embodiment, the thickness of the first wall 321 may vary depending on the first material. For example, the thickness of the first wall 321 with the first material being copper and/or aluminum may be greater than the thickness of the first wall 321 with the first material being steel.

According to various example embodiments, the microporous structure 330 may be deformed to increase the density of a nucleation site, which may impart hydrophilicity to the first inner surface 321a and increase the surface energy of the first inner surface 321a on which the microporous structure 330 is formed. In an example embodiment, the first inner surface 321a may be a super-hydrophilic surface having a contact angle of about 5° or less.

In an example embodiment, in the case of the first wall 321 that is formed of aluminum, the microporous structure 330 may be formed through anodization of the first inner surface 321a. In an example embodiment, surface processing may be performed on the first inner surface 321a using a nanosecond pulsed laser (ns-pulsed laser), and a heat treatment may then be performed for a predetermined period of time (e.g., about six hours) at a predetermined temperature (e.g., about 200° C.) without using chemical substances, and thus the first inner surface 321a may become super-hydrophobic. Additionally, a surface treatment may then be performed on the first inner surface 321a in boiling water for a predetermined period of time (e.g., about two hours), and thus the wettability of the first inner surface 321a may be changed, and the microporous structure 330 formed as a super-hydrophilic pseudo-boehmite nanostructure may thereby be formed on the first inner surface 321a. In an example embodiment, the first inner surface 321a may be coated with a predetermined material (e.g., Parlen 4526) and may thereby become hydrophilic.

In an example embodiment, in the case of the first wall 321 that is formed of steel, a surface treatment may be performed on the first inner surface 321a through sandblasting using alumina (e.g., aluminum oxide) of a predetermined fine size (e.g., about 320 to 400 mesh), which may impart hydrophilicity to the first inner surface 321a. In an example embodiment, the first inner surface 321a may be coated with a predetermined material (e.g., Paltop 3975(SUS304)) and may thereby become hydrophilic.

In an example embodiment, in the case of the first wall 321 that is formed of copper, chemical etching may be performed on the first inner surface 321a, and the first inner surface 321a may then be coated with a hydrophilic film forming treatment solution, which may impart hydrophilicity to the first inner surface 321a. In this case, the hydrophilic film forming treatment solution may be, for example, potassium silicate, and the potassium silicate may be about 25.5 to 27.5% of silicon dioxide ($SiO_2$) and about 12.5 to 14.5% of potassium oxide ($K_2O$). In an example embodiment, copper powder sintering may be performed on the first inner surface 321a, and the first inner surface 321a may then be coated with silicon dioxide ($SiO_2$)/isopropanol (e.g., PX-10 product), which may impart super-hydrophilicity to the first inner surface 321a.

However, imparting hydrophilicity to the first inner surface 321a is not limited to the example embodiments described above, and various other methods may be used to impart hydrophilicity. For example, chemical etching, solution immersion, spray coating, laser electrodeposition, template deposition, chemical/physical vapor deposition, laser ablation, coating, electrolytic deposition, electrophoretic deposition, electrochemical deposition, sputtering, electron beam evaporation, any other suitable method, or a combination of one or more thereof may be employed.

The second wall 322 may be disposed opposite the first wall 321 far (e.g., spaced apart) from the heat source 389. The second wall 322 may have a second inner surface 322a forming at least a portion of the inner space S of the thermal management chamber 312 and a second outer surface 322b opposite the second inner surface 322a. The second inner surface 322a may be hydrophobic. In an example embodiment, the second wall 322 may include a hydrophobic surface body 340 formed on the second inner surface 322a. In an example embodiment, the second wall 322 may be formed of a second material. The second material may be, for example, copper, aluminum, stainless steel, titanium, and/or other metal materials, or combinations thereof. In an example embodiment, the second material of the second wall 322 may be substantially the same as the material of the main body 311 for maintaining the rigidity of the electronic device 301. In an example embodiment, the second outer surface 322b may contact the intermediate layer 313. In an example embodiment, the second wall 322 may be seamlessly and integrally formed with the main body 311.

The hydrophobic surface body 340 may roughen the second inner surface 322a by any suitable methods to be formed into a micro/nano structure, and various surface modification methods may then be performed on the second inner surface 322a. The second inner surface 322a may thereby have low surface energy with hydrophobicity. In an example embodiment, the second inner surface 322a may be a super-hydrophobic surface having a contact angle of about 150° or greater.

In example embodiments, in the case of the second wall 322 that is formed of aluminum, super-hydrophobicity may be imparted to the second inner surface 322a as chemical etching is performed on the second inner surface 322a. In an example embodiment, after polishing the second inner surface 322a to roughen the second inner surface 322a and cleaning the second inner surface 322a, treating the second inner surface 322a with sodium hydroxide (NaOH) and then treating it with hydrogen chloride (HCL) and acetic acid ($CH_3COOH$), then immersing the second inner surface 322a in a silane solution may increase a maximum contact angle of the second inner surface 322a. In an example embodiment, after treating the second inner surface 322a with hydrochloric acid (HCL) and copper nitrate ($Cu(NO_3)_2$), and treating it with a fluoroalkyl silane (FAS) solution may be performed. In an example embodiment, after treating the second inner surface 322a with hydrogen fluoride (HF) and hydrochloric acid (HCL), and treating it with perfluoroalkyl triethoxysilane (PFO), polyamide (PA), room temperature vulcanized coating, and/or hexadecyl-trimethoxy silane may be performed.

In addition, in the example embodiments, in the case of the second wall 322 that is formed of aluminum, before performing the surface treatment on the second inner surface 322a as described above, anodization may be performed on the second inner surface 322a to obtain the super-hydrophilic surface, or a surface treatment using KH-832 in ethanol may be performed to obtain the super-hydrophobic surface. In an example embodiment, anodization may be performed on the second inner surface 322a using a phrophosphoric acid solution of 74% concentration at a constant cell voltage of to 75V to obtain the second inner surface 322a that is super-hydrophilic, and then treatment using fluorophosphoric acid SAM (3,3,4,4,5,5,6,6,7,7,8,8,8-tridecafluorooctylphosphonic acid, FOPA) of about 0.5 mM concentration/an ethanol solution at 293-323 Kelvin (K) may be performed to obtain the second inner surface 322a that is super-hydrophobic.

In an example embodiment, in the case of the second wall 322 that is formed of aluminum, another surface treatment, in addition to etching, may be performed on the second inner surface 322a. For example, solder or epoxy may be used to form a thermally conductive microporous coating with a predetermined thickness (e.g., about 7 to 150 μm) on the second inner surface 322a. In an example embodiment, electrolytic deposition of aluminum particles having a predetermined size (e.g., about 3 to 30 μm) may be performed on the second inner surface 322a to obtain the second inner surface 322a that is super-hydrophobic.

In an example embodiment, in the case of the second wall 322 that is formed of copper, super-hydrophobicity may be imparted to the second inner surface 322a as chemical etching is performed on the second inner surface 322a. For example, after a treatment using nitric acid ($HNO_3$) and silver nitrate ($AgNO_3$) may be performed on the second inner surface 322a, a treatment using a fluoroalkyl silane (FAS) solution may be performed.

In an example embodiment, in the case of the second wall 322 that is formed of titanium, after performing sandblasting on the second inner surface 322a, performing etching using a sulfuric acid ($H_2SO_4$) and alkali solution and annealing, and then using a FAS-17 solution may obtain the second inner surface 322a that is super-hydrophobic.

In an example embodiment, in the case of the second wall 322 that is formed of steel and/or magnesium, a spray coating may be applied to the second inner surface 322a. For example, after performing a polishing process and a drying process on the second inner surface 322a, leaving the second inner surface 322a in a high-humidity neutral spray chamber containing a sodium chloride (NaCl) solution for a predetermined period of time (e.g., about 2 hours) may form a needle-like fine structure on the second inner surface 322a, and then putting it in 1% by weight of FAS-17 may modify the surface.

In an example embodiment, in the case of the second wall 322 that is formed of steel, electrochemical etching may be performed on the second inner surface 322a in diluted aqua regia (e.g., about 3.6% hydrochloric acid (HCL) and about 1.2% nitric acid ($HNO_3$) solution).

The plurality of third walls 323 may connect the first wall 321 and the second wall 322. The plurality of third walls 323 may define the height of the inner space S of the thermal management chamber 312. The plurality of third walls 323 may each have a third inner surface 323a forming at least a portion of the inner space S of the thermal management chamber 312. In an example embodiment, the third walls 323 may be formed of a third material. The third material may be, for example, copper, aluminum, stainless steel, titanium, and/or other metal materials, or combinations thereof. In an example embodiment, the third material of the plurality of third walls 323 may be substantially the same as the material of the main body 311 to maintain the rigidity of the electronic device 301. In an example embodiment, the plurality of third walls 323 may be seamlessly and integrally formed with the main body 311. In an example embodiment, the second wall 322 and the plurality of third walls 323 may be seamlessly and integrally formed with each other.

In an example embodiment, the first material may be substantially the same as the third material. This may facilitate a connection between the first wall 321 and the plurality of third walls 323. In an example embodiment, the first material may be different from the third material. In various example embodiments, a thermal resistance of the first material may be less than that of the third material. This may improve thermal conduction from the heat source 389 to the working fluid F through the first wall 321 while maintaining the rigidity of the electronic device 301 through the plurality of third walls 323.

The thermal management chamber 312 may contain the working fluid F accommodated in the inner space S. In an example embodiment, the working fluid F may be in a liquid state. In an example embodiment, the working fluid F may include water.

The thermal management chamber 312 may be configured to generate bubbles C in the working fluid F at or above a critical boiling temperature of the working fluid F. In an example embodiment, the inner space S of the thermal management chamber 312 may be substantially in a vacuum environment. For example, in the case of the working fluid F being water, for the onset of nucleate boiling of the working fluid F at substantially the same temperature as a desired operating control temperature (e.g., about 40° C.), to allow the thermal management chamber 312 to operate at the desired operating control temperature of the electronic device 301, an internal pressure of the inner space S of the thermal management chamber 312 may be reduced to be lower than (e.g., about 0.1 bar) an atmospheric pressure by reducing a saturation temperature of the working fluid F. For example, in the process of manufacturing the thermal management chamber 312, when the working fluid F is injected into the inner space S of the thermal management chamber 312, a vacuum pump may be connected to the inner space S to reduce the internal pressure.

In an example embodiment, the working fluid F of a sufficient amount that ensures a fluid circulation structure between the first inner surface 321a and the second inner surface 322a may be received in the thermal management chamber 312. For example, the amount of the working fluid F received in the inner space S of the thermal management chamber 312 may be determined based on the position and orientation of the thermal management chamber 312 under gravity. In an example embodiment, when the thermal management chamber 312 is oriented such that the first wall 321 is disposed on an upper side and the second wall 322 is disposed on a lower side, as opposed to the orientation shown in FIG. 2, the microporous structure 330 formed on the first inner surface 321a may be present in any one volume in the inner space S, and the working fluid F may be filled in another remaining volume. In an example embodiment, when the thermal management chamber 312 is oriented such that the first wall 321 is disposed on the lower side and the second wall 322 is disposed on the upper side as shown in FIG. 2, the inner space S may include one volume in which the hydrophobic surface body 340 formed on the second inner surface 322a or a reinforcing structure (e.g., a first reinforcing rib 1151 and/or a second reinforcing rib 1152) is present and another remaining volume filled with the working fluid F. In an example embodiment, the working fluid F may fill substantially 70% or more of the inner space S of the thermal management chamber 312. In various example embodiments, the working fluid F may fill 60% or more of the inner space S of the thermal management chamber 312. In various example embodiments, ⅓ or more of the inner space S of the thermal management chamber 312 may be filled. The filling amount of the working fluid F described above may allow the bubbles C to be generated from the first inner surface 321a near the heat source 389, and the generated bubbles C may be condensed on the second inner surface 322a to form a droplet D on the second inner surface 322a, and when the droplet D grows to a certain size or greater, it may move toward the first inner surface 321a, forming the circulation structure of the working fluid F.

In an example embodiment, the thermal management chamber 312 may include a junction 324 that connects the first wall 321 and the plurality of third walls 323. For example, the first wall 321 may be manufactured separately from the plurality of third walls 323 and then connected to the plurality of third walls 323. Before the first wall 321 is connected to the plurality of third walls 323, the working fluid F may be filled in the inner space S of the thermal management chamber 312, and an environment of the inner space S may be established such that the working fluid F may operate according to the boiling principle. In an example embodiment, the junction 324 may be formed by laser welding, brazing, diffusion bonding, and other bonding methods.

In an example embodiment, the thermal management chamber 312 may be detachably coupled to the main body 311. The expression "detachably coupled" may refer, for example, to the thermal management chamber 312 being manufactured as a separate part from the main body 311 and coupled to the main body 311. In an example embodiment, the thermal management chamber 312 may be mounted on the main body 311. In an example embodiment not shown, the second wall 322 and the plurality of third walls 323 may form at least a portion of the thermal management chamber 312 without being seamlessly connected to the main body 311. When the thermal management chamber 312 is coupled to the main body 311, the second wall 322 and the plurality of third walls 323 may be coupled to the main body 311.

In an example embodiment, a distance between the first inner surface 321*a* and the second inner surface 322*a* may be set to a value that may allow the heat generated from the heat source 389 to be dissipated through the thermal management chamber 312 when the working fluid F reaches a boiling saturation temperature, while ensuring the fluid circulation of the working fluid F without a separate component (e.g., a circulation pump and a wick structure) between the first inner surface 321*a* and the second inner surface 322*a*. For example, the distance between the first inner surface 321*a* and the second inner surface 322*a* may be about 0.2 mm or greater. For another example, the distance between the first inner surface 321*a* and the second inner surface 322*a* may be about 0.4 mm or less.

Figure 3B:
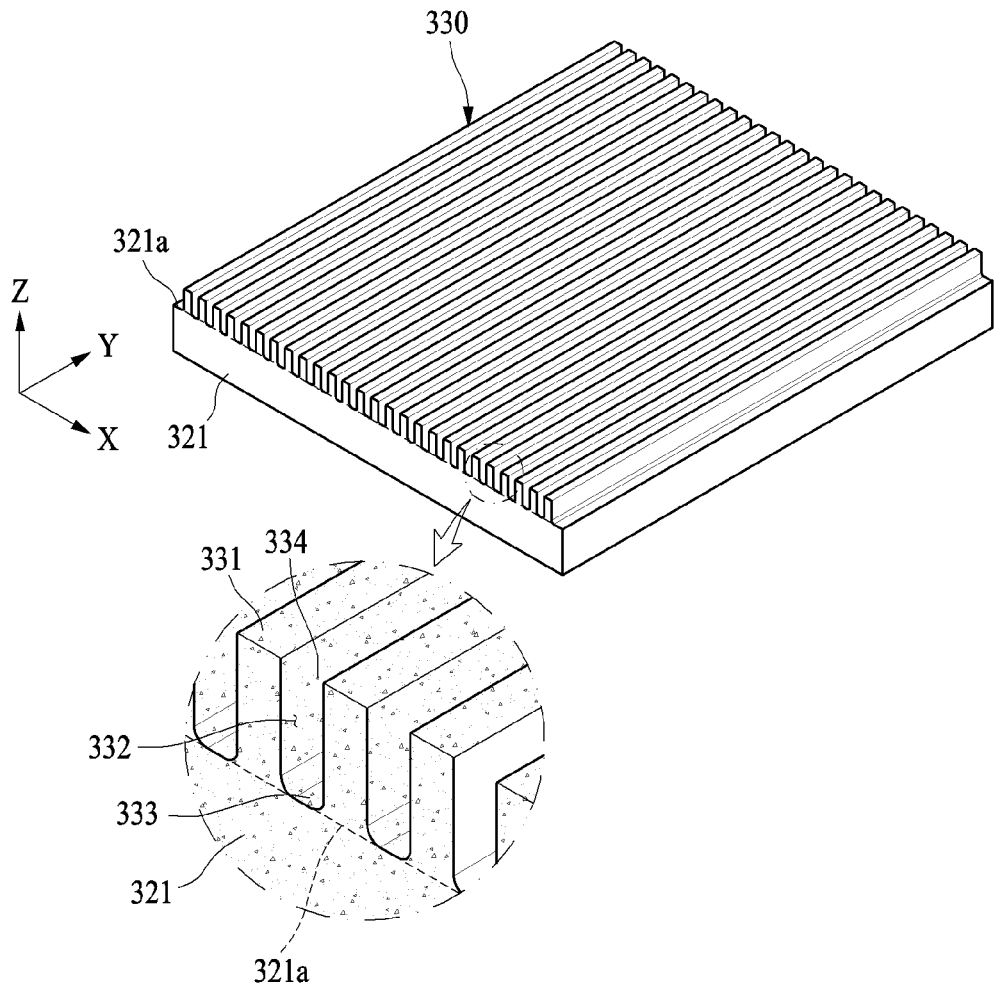
FIG. 3B is a perspective view illustrating a partial area a microporous structure of the first wall illustrated in FIG. 3A according to various example embodiments.

Referring to FIG. 3B, the microporous structure 330 formed on at least a portion of the first inner surface 321*a* of the first wall 321 according to an example embodiment may include a plurality of pillars 331. The plurality of pillars 331 may protrude in a third direction (e.g., a normal direction of the first inner surface 321*a* or a Z direction) crossing a first direction (e.g., an X direction) and a second direction (e.g., a Y direction) of the first inner surface 321*a* from the first inner surface 321*a*. The plurality of pillars 331 may extend in the second direction (e.g., the Y direction) crossing the first direction of the first inner surface 321*a*. The plurality of pillars 331 may be spaced apart from each other on the first inner surface 321*a* along the first direction (e.g., the X direction) of the first inner surface 321*a*. A pair of adjacent pillars 331 may form a flow channel 332 between a pair of adjacent pillars 331. The flow channel 332 may guide air bubbles (e.g., bubbles C) generated from the first inner surface 321*a* heated by a heat source (e.g., the heat source 389) and separated from the first inner surface 321*a* in a protruding direction of the plurality of pillars 331. In addition, the flow channel 332 may induce fluid mixing of a working fluid (e.g., the working fluid F) to substantially increase a convective heat transfer coefficient and heat flux of the working fluid.

In an example embodiment, the microporous structure 330 may include a recess 333 formed between a pair of adjacent pillars 331. In an example embodiment, at least a portion of the recess 333 may form the first inner surface 321*a*. In an example embodiment, the recess 333 may form a curved surface between a pillar 331 and the first inner surface 321*a*. In an example embodiment, the recess 333 may form at least one surface formed at a predetermined angle between a pillar 331 and the first inner surface 321*a*.

In an example embodiment, the microporous structure 330 may include a sintered metal powder coating 334 formed on the plurality of pillars 331 and/or a plurality of recesses 333. The sintered metal powder coating 334 may substantially increase a contact area between the first inner surface 321*a* and the working fluid, improve a conductivity of the working fluid in contact with the first inner surface 321*a*, and increase the speed of formation of bubbles generated from the first inner surface 321*a*, thereby improving a boiling process of the working fluid. This may reduce a boiling entry temperature of the working fluid, compared to a surface on which the sintered metal powder coating 334 is not formed, and allow wall superheat of the first wall 321 to be substantially zero. This may further improve a cooling efficiency of an electronic device (e.g., the electronic device 301) when using a heat source that generates a relatively higher heat flux of a working fluid. In an example embodiment, where the material of the first wall 321 is copper, the metal used for the sintered metal powder coating 334 may be copper.

Figure 17:
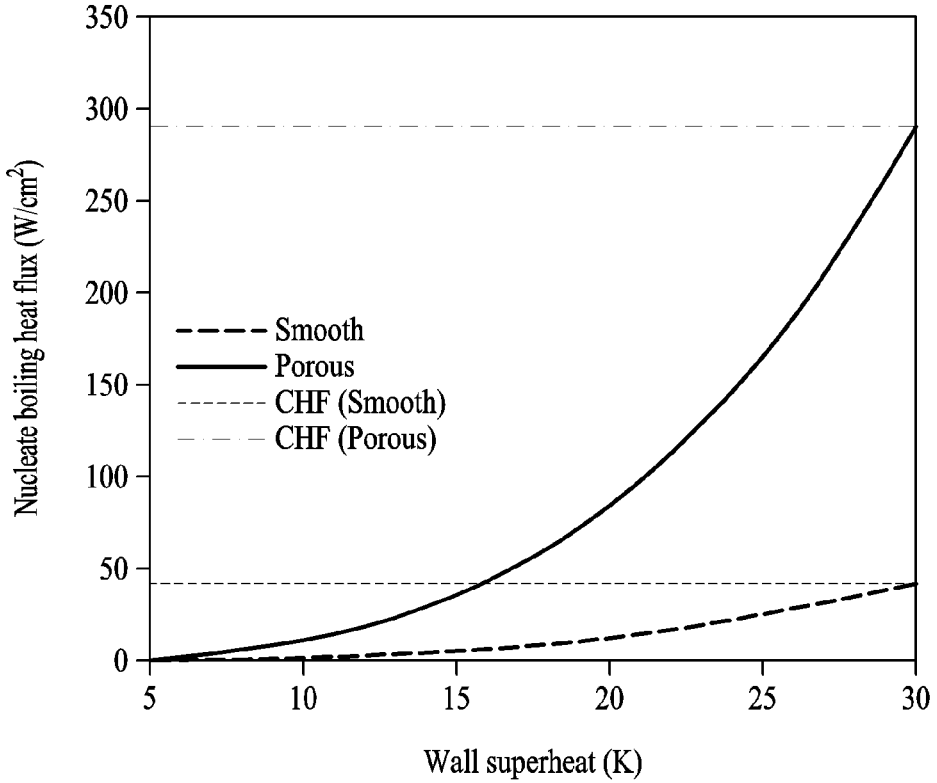
Figure 18:
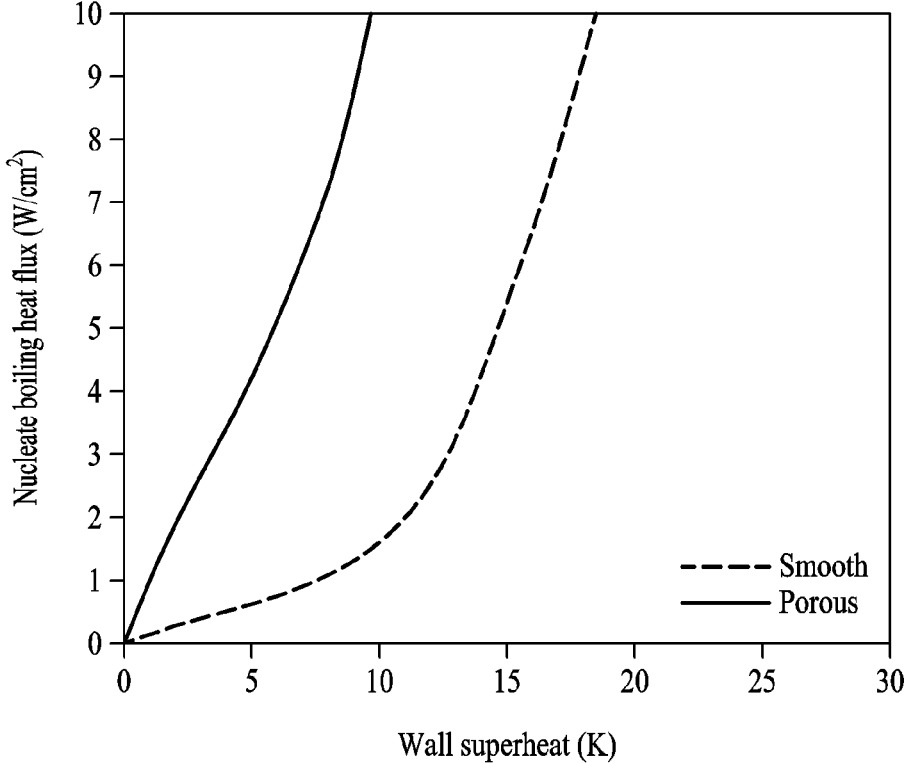

FIGS. 17 and 18 are graphs of heat flux and critical heat flux (CHF) performance at an operating temperature of about 40° C. of a first inner surface that is substantially smooth without the sintered metal powder coating 334 and the first inner surface 321*a* that is substantially rough with the sintered metal powder coating 334 according to various example embodiments. FIG. 17 is a graph showing CHFs, and FIG. 18 is a graph showing a nucleate boiling heat flux range corresponding to an electronic device. The graphs are obtained under the assumption that the substantially rough first inner surface 321*a* on which the sintered metal powder coating 334 is formed by being coated with copper particles having the size of about 20 μm such that it has a porosity of about ⅓, that is, a ratio of an area of the sintered metal powder coating 334 to an area of the first inner surface 321*a* is ⅓.

$$\frac{Q}{A} = q = \left[\frac{c_l \Delta T}{h_{fg} Pr^n C_{sf}}\right]^3 \mu_l h_{fg} \left[\frac{g(\rho_l - \rho_v)}{g_0 \sigma}\right]^{0.5} \qquad \text{[Equation 1]}$$

In Equation 1, q denotes a nucleate boiling heat flux (W/m$^2$), $c_l$ denotes specific heat of a liquid (J/kg K), $\Delta T$ denotes an excess temperature (° C. or K), and $h_{fg}$ denotes an enthalpy of vaporization (J/kg), $P_r$ denotes a Prandtl number of the liquid, n denotes an experimental constant (e.g. n equals 1 for water and 1.7 for other liquids), $C_{sf}$ denotes a surface fluid factor (e.g., $C_{sf}$ of water and nickel is 0.006), $\mu_l$ denotes a dynamic viscosity of the liquid (kg/m·s), g denotes a gravitational acceleration (m/s$^2$), go denotes a force conversion factor (kg·m/N·s$^2$), $\rho_l$ denotes a density of the liquid (kg/m$^3$), $\rho_v$ denotes a density of vapor (kg/m$^3$), and σ denotes a liquid-vapor interface surface tension (N/m).

In terms of a heat transfer rate at nucleate (pool) boiling calculated through the Rohsenow correlation represented by Equation 1 above, calculation results for both surfaces have a significant difference, and the substantially rough first inner surface 321*a* may have a relatively higher CHF than the substantially smooth first inner surface. Thus, the substantially rough first inner surface 321*a* may have an improved thermal stability, and a boiling instability of the working fluid may be suppressed. The sintered metal powder coating 334 may prolong the CHF of the working fluid higher, and the thickness of the sintered metal powder coating 334 is very small compared to a hydraulic diameter, and thus an internal pressure (or vapor pressure) of a liquid of a thermal management chamber (e.g., the thermal management chamber 312) may not be greatly affected thereby. As the frequency of the generation of bubbles and the escape of bubbles is improved in a portion of the first inner surface 321a where nucleate boiling occurs, the thickness of a superheated fluid layer may be reduced and a micro-convection heat transfer may be increased, and thus the working fluid may boil at a relatively lower heat flux and a relatively lower wall superheat.

As described above, homogeneous bubble nucleation in the superheated fluid may not significantly affect a heat transfer of the working fluid, and heterogeneous bubble nucleation may mainly contribute to the heat transfer along the surface of the microporous structure 330 on the heated first inner surface 321a immersed in the working fluid, and thus the boiling performance of the working fluid may be improved through a structural modification of an interface to the first inner surface 321a. For an electronic device (e.g., the electronic device 301), the thickness of a thermal management chamber (e.g., the thermal management chamber 312) (e.g., a distance between the first inner surface 321a and the second inner surface 322a) may be extremely small, which may minimize and/or reduce a temperature difference by a thermal conduction between the first inner surface 321a and the working fluid. Thus, when a temperature of a heat source (e.g., the heat source 389) reaches an onset temperature of a nucleate boiling interval, a temperature of the working fluid may also quickly reach above a saturation temperature.

The method in which Equation 1 above representing the Rohsenow correlation is applied to electronic devices according to various example embodiments described herein may be to numerically predict CHF and nucleate boiling heat flux (q) values of the respective electronic devices according to various example embodiments, based on surface roughness according to materials of the electronic devices or processing methods and on physical property values of a working fluid, and to verify the effectiveness of the electronic devices, compared to conventional electronic devices based on the calculated values.

Figure 4:
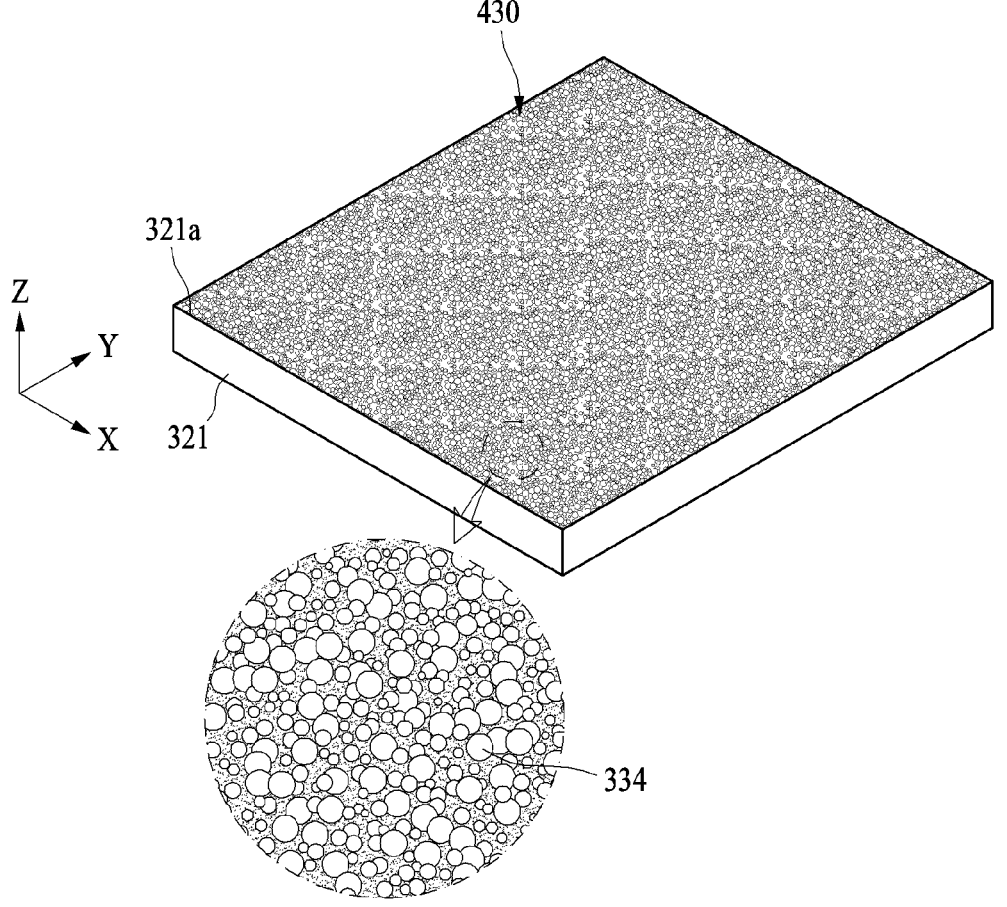
FIG. 4 is a perspective view of a first wall of a thermal management chamber according to various example embodiments

Referring to FIG. 4, a microporous structure 430 (e.g., the microporous structure 330) formed on the first inner surface 321a of the first wall 321 according to an example embodiment may include the sintered metal powder coating 334 formed on the first inner surface 321a without the plurality of pillars 331 and/or the plurality of recesses 333. In an example embodiment, the size of an area of the sintered metal powder coating 334 may be about ⅓ or more of the size of an area of the first inner surface 321a.

In addition to example embodiments of the microporous structures 330 and 430 described with reference to FIGS. 3A, 3B, and 4, there may be various other surface processing methods to process the first inner surface 321a. For example, chemical etching, laser processing, wire cutting, and/or other surface processing methods may be applied. Such surface processing methods may form a structure having a circular or polygonal cross section on the first inner surface 321a, a horn-shaped structure, and a structure of various types having various shapes (e.g., fin, pin, protrusion, recess, line, coated surface, multi-pore, and foam). Such a structure may have, for example, a height of about 50 μm or less or a height of about 20 μm or less, and the height and/or thickness of the structure and the gap between such adjacent structures may be about 50 μm or less to minimize and/or reduce a space occupied by the structure. In an example embodiment, forming various structures (e.g., an array of pins, grids, dimples, holes, channels, and pillars) of a micro-and/or nano-scale on the first inner surface 321a (e.g., a surface formed of SUS 316L) using low power (e.g., about 1.5 W) and high-frequency pulse laser ablation may improve a CHF of a working fluid and generate a nucleation site. For example, the laser beam size may be about 30 μm, the laser pulse duration may be about 50 nm, and the scanning speed may be about m/s.

Hereinafter, example shapes and configurations of a microporous structure will be described according to various example embodiments.

Figure 5A:
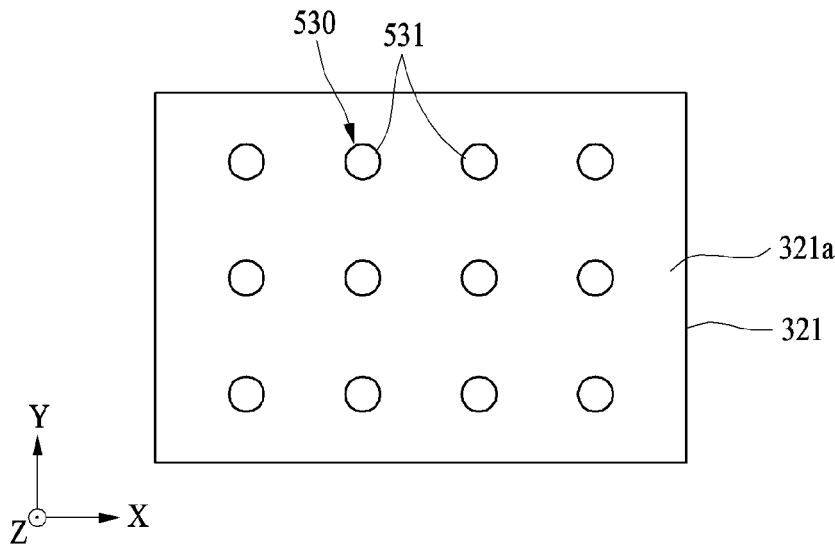
FIG. 5A is a diagram illustrating a top view of a first wall of a thermal management chamber according to various example embodiments.
Figure 5B:
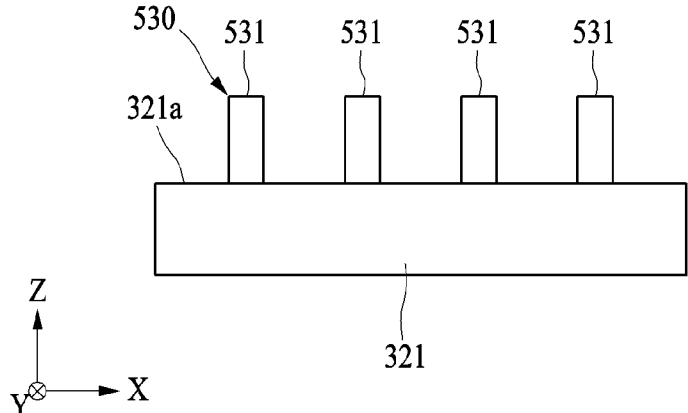
FIG. 5B is a diagram illustrating a side view of the first wall of FIG. 5A according to various example embodiments.

Referring to FIGS. 5A and 5B, a microporous structure 530 according to an example embodiment may include a plurality of pillars 531 having substantially circular cross-sections protruding in a third direction (e.g., a Z direction) crossing each of a first direction (e.g., an X direction) and a second direction (e.g., a Y direction) from the first inner surface 321a of the first wall 321. In an example embodiment, the plurality of pillars 531 may be formed on the first inner surface 321a in the form of an M×N matrix along the first and second directions. For example, the plurality of pillars 531 may be substantially linearly arranged in a line for each column.

Figure 6A:
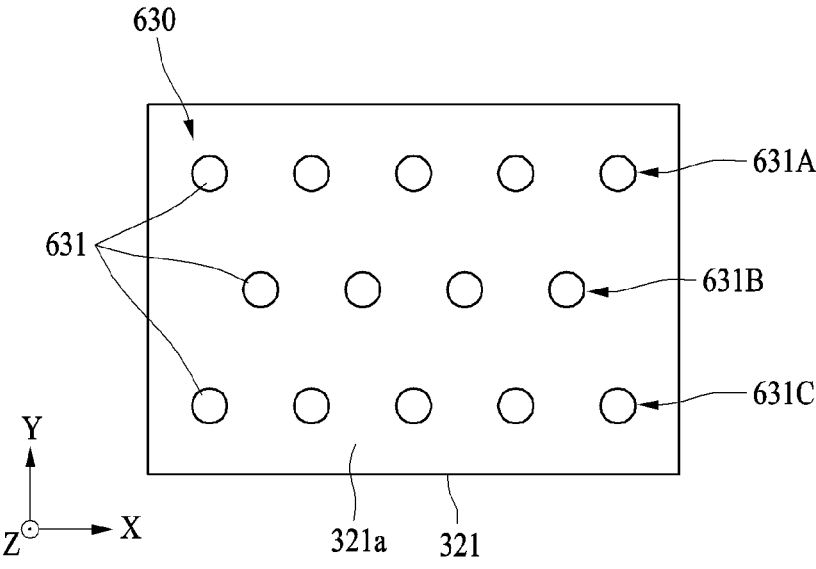
FIG. 6A is a diagram illustrating a top view of a first wall of a thermal management chamber according to various example embodiments.
Figure 6B:
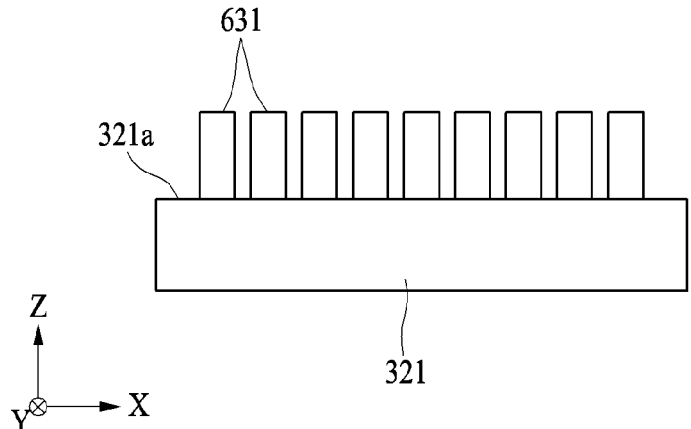
FIG. 6B is a diagram illustrating a side view of the first wall of FIG. 6A according to various embodiments.

Referring to FIGS. 6A and 6B, a microporous structure 630 according to an example embodiment may include a plurality of pillars 631 having substantially circular cross-sections protruding in a third direction (e.g., a Z direction) crossing each of a first direction (e.g., an X direction) and a second direction (e.g., a Y direction) from the first inner surface 321a of the first wall 321, and the plurality of pillars 631 may be arranged for each of a plurality of sets 631A, 631B, and 631C with each set arranged in a different form from other sets. In an example embodiment, a plurality of pillars 631 included in the first set 631A and the third set 631C among the plurality of sets 631A, 631B, and 631C may be arranged in the first direction while substantially overlapping each other and, when viewed along the second direction. Also, a plurality of pillars 631 included in the second set 631B may be arranged in the first direction while not substantially overlapping the plurality of pillars 631 included in the first set 631A and the third set 631C, when viewed along the second direction.

Figure 7A:
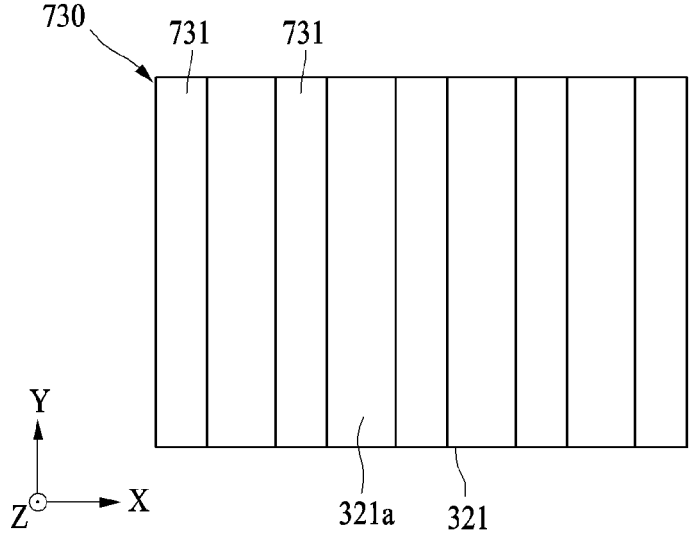
FIG. 7A is a diagram illustrating a top view of a first wall of a thermal management chamber according to various example embodiments.
Figure 7B:
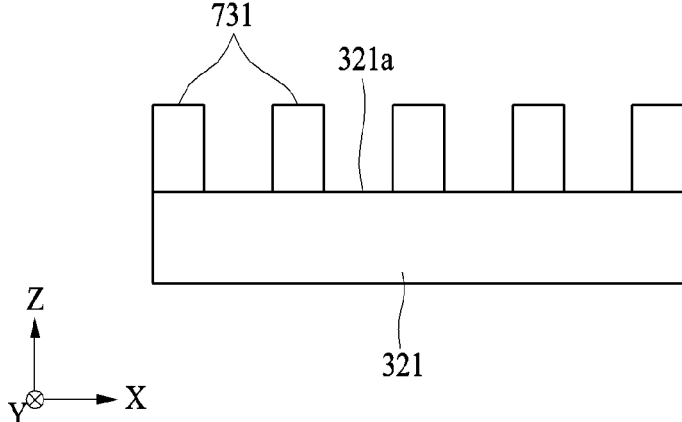
FIG. 7B is a diagram illustrating a side view of the first wall of FIG. 7A according to various example embodiments.

Referring to FIGS. 7A and 7B, a microporous structure 730 according to an example embodiment may include a plurality of ribs 731 protruding in a third direction (e.g., a Z direction) crossing each of a first direction (e.g., an X direction) and a second direction (e.g., a Y direction) from the first inner surface 321a of the first wall 321. The plurality of ribs 731 may extend on at least a portion of the first inner surface 321a in the first direction or the second direction of the first inner surface 321a. The plurality of ribs 731 may form a channel by being spaced apart from each other in a direction (e.g., the X direction) crossing a direction (e.g., the Y direction) in which the plurality of ribs 731 extend.

Figure 8A:
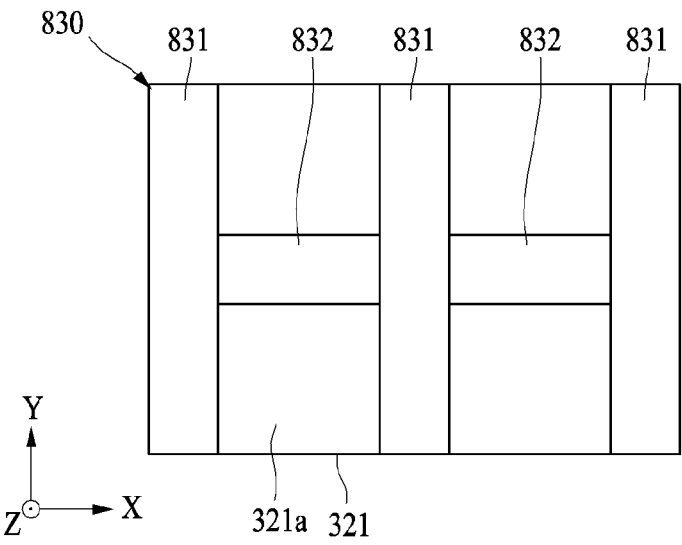
FIG. 8A is a diagram illustrating a top view of a first wall of a thermal management chamber according to various example embodiments.
Figure 8B:
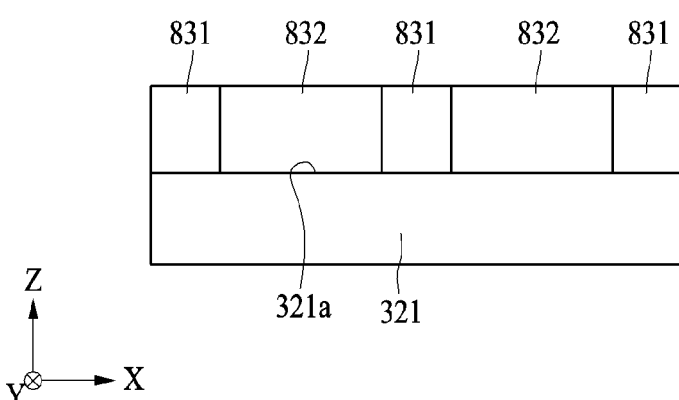
FIG. 8B is a diagram illustrating a side view of the first wall of FIG. 8A according to various example embodiments.

Referring to FIGS. 8A and 8B, a microporous structure 830 according to an example embodiment may include a plurality of first ribs 831 protruding from a third direction (e.g., a Z direction) crossing each of a first direction (e.g., an X direction) and a second direction (e.g., a Y direction) from the first inner surface 321a of the first wall 321, and at least one second rib 832. The plurality of first ribs 831 may extend on at least a portion of the first inner surface 321a in the second direction of the first inner surface 321a, and the at least one second rib 832 may extend on at least a portion of the first inner surface 321a in the first direction of the first inner surface 321a to meet the plurality of first ribs 831. In an example embodiment, the plurality of first ribs 831 and the at least one second rib 832 may form the microporous structure 830 of a grid shape.

Figure 9A:
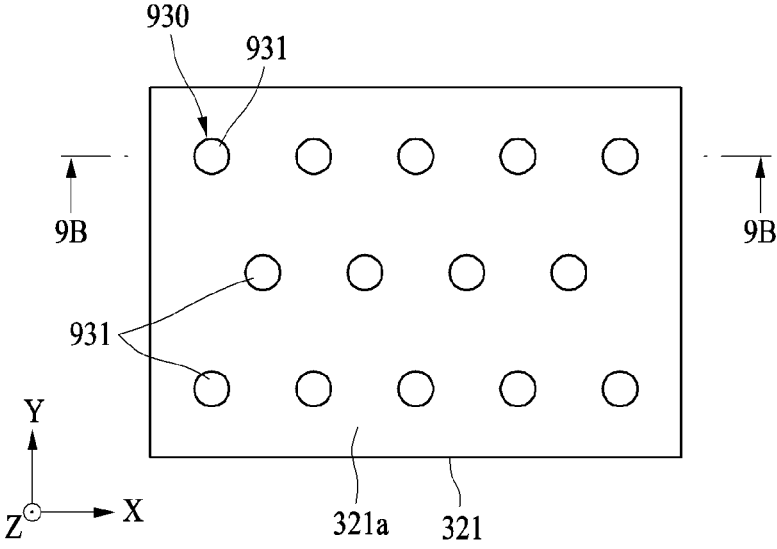
FIG. 9A is a diagram illustrating a top view of a first wall of a thermal management chamber according to various example embodiments.
Figure 9B:
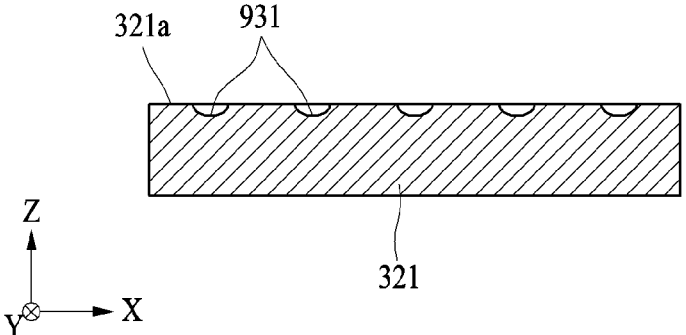
FIG. 9B is a cross-sectional view of the first wall of FIG. 9A taken along line 9B-9B of FIG. 9A according to various example embodiments.

Referring to FIGS. 9A and 9B, a microporous structure 930 according to an example embodiment may include a plurality of dimples 931 recessed on the first inner surface 321a of the first wall 321. In an example embodiment, the plurality of dimples 931 may be formed on the first inner surface 321a in the form of an M×N matrix along one direction (e.g., a Y direction) and/or another direction (e.g., an X direction) of the first inner surface 321a (e.g., the X direction). In an example embodiment, one dimple 931 and another dimple 931 of the plurality of dimples 931 may not overlap when viewed along the one direction (e.g., the Y direction) of the first inner surface 321a.

Figure 10A:
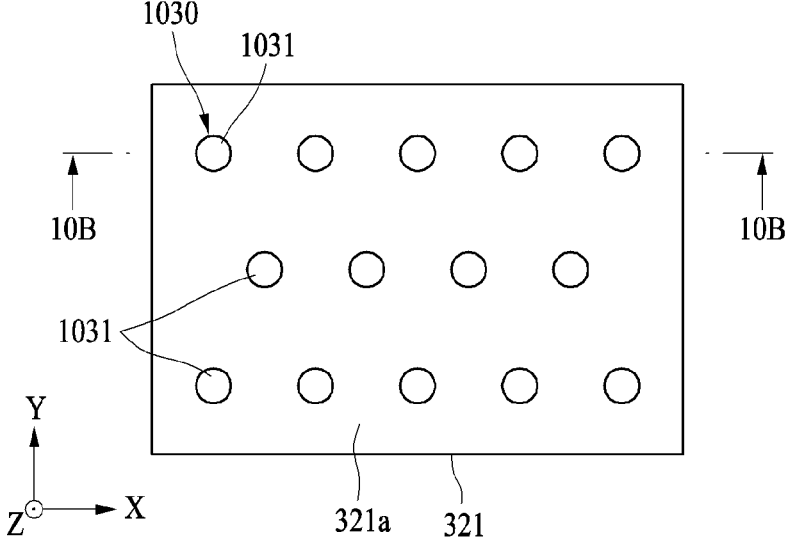
FIG. 10A is a diagram illustrating a top view of a first wall of a thermal management chamber according to various example embodiments.
Figure 10B:
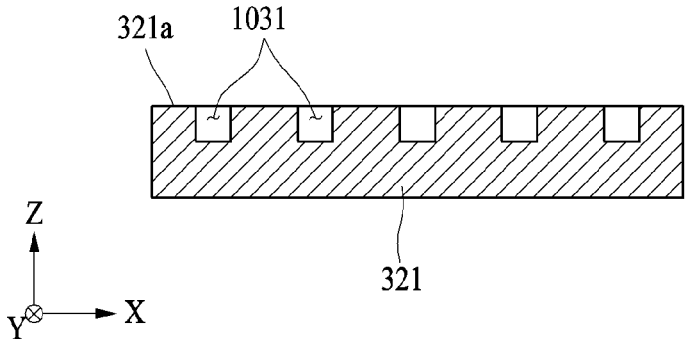
FIG. 10B is a cross-sectional view of the first wall of FIG. 10A taken along line 10B-10B of FIG. 10A according to various example embodiments.

Referring to FIGS. 10A and 10B, a microporous structure 1030 according to an example embodiment may include a plurality of holes 1031 formed into the first inner surface 321a of the first wall 321. In an example embodiment, the plurality of holes 1031 may be formed into the first inner surface 321a in the form of an M×N matrix along one direction (e.g., a Y direction) and/or another direction (e.g., an X direction) of the first inner surface 321a. In an example embodiment, one hole 1031 and another hole 1031 of the plurality of holes 1031 may not overlap when viewed along one direction (e.g., the Y direction) of the first inner surface 321a.

Figure 11:
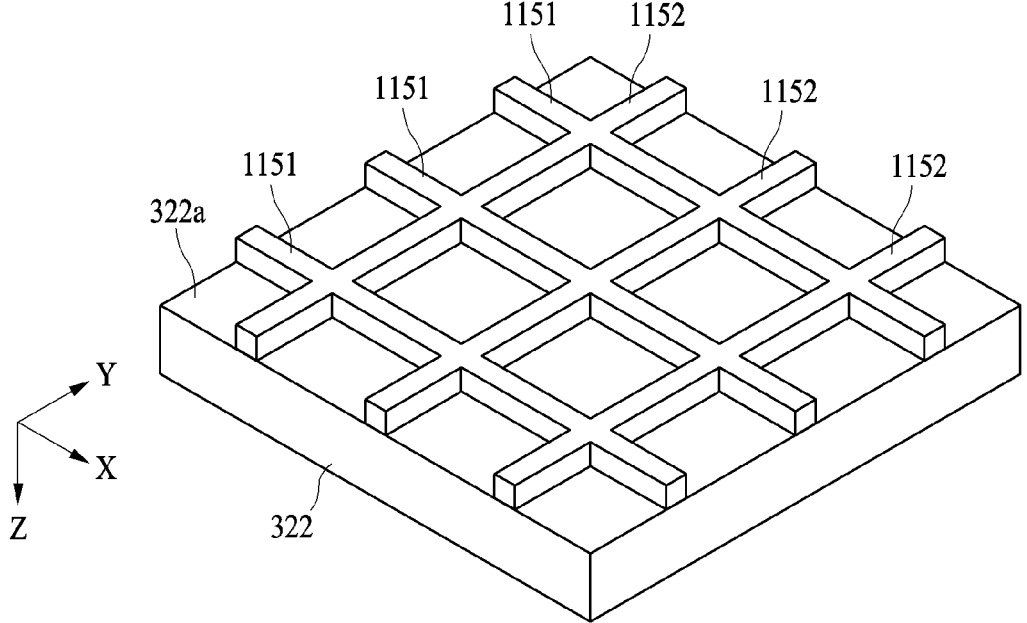
FIG. 11 is a perspective view of a second wall of a thermal management chamber according to various example embodiments.

Referring to FIG. 11, the second wall 322 according to an example embodiment may include at least one reinforcing rib 1151 or 1152 formed on the second inner surface 322a. The at least one reinforcing rib 1151 or 1152 may delay or prevent and/or reduce a thermal management chamber (e.g., thermal management chamber 312) from being dented as an internal pressure of an internal space (e.g., the internal space S) of the thermal management chamber is lower than an atmospheric pressure to prevent and/or reduce the thermal management chamber from being deformed and maintain the shape of the thermal management chamber. In an example embodiment, the second wall 322 may include a plurality of first ribs 1151 extending in a first direction (e.g., an X direction) of the second inner surface 322a and spaced apart from each other in a second direction (e.g., a Y direction), and a plurality of second reinforcing ribs 1152 extending in the second direction (e.g., the Y direction) of the second inner surface 322a and spaced apart from each other in the first direction (e.g., the X direction). In an example embodiment, the plurality of first reinforcing ribs 1151 and the plurality of second reinforcing ribs 1152 may meet each other. In various example embodiments, at least some of the plurality of first reinforcing ribs 1151 and at least some of the plurality of second reinforcing ribs 1152 may not meet each other.

Figure 12:
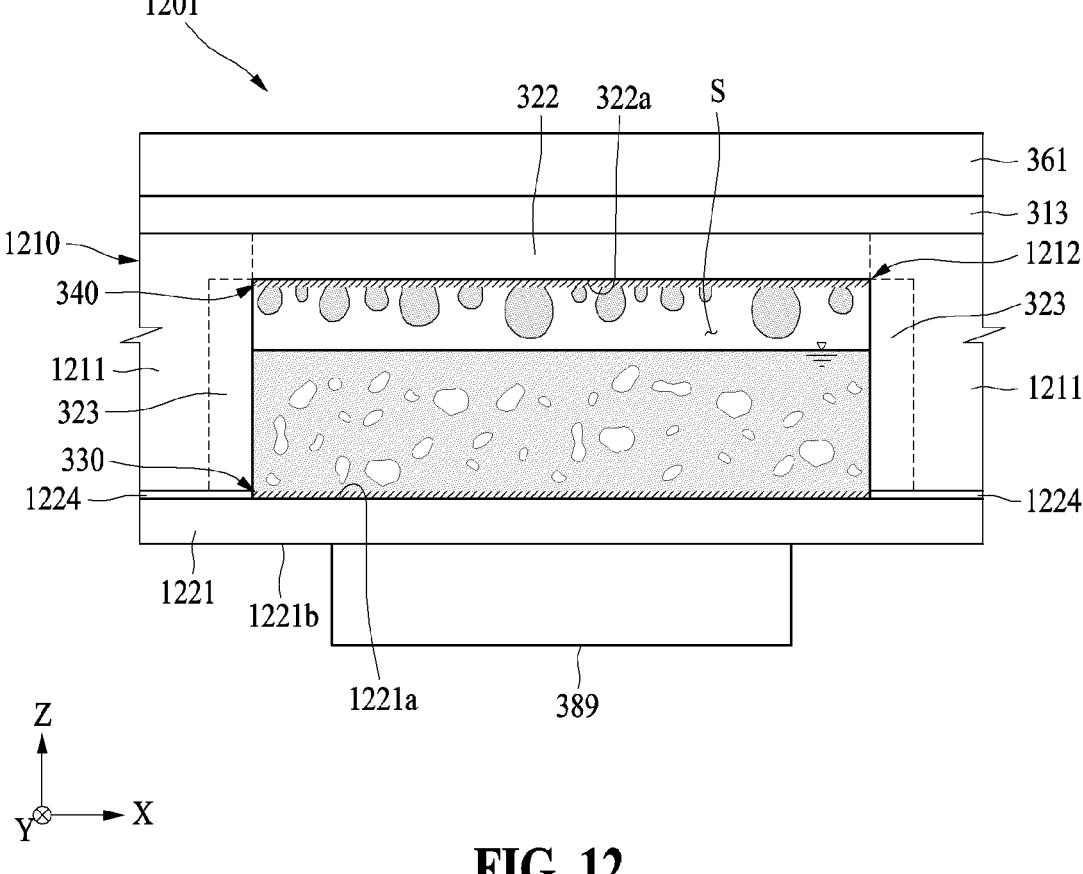
FIG. 12 is a cross-sectional view of a partial area of an electronic device (e.g., the electronic device of FIG. 3A) according to various example embodiments.

Referring to FIG. 12, an electronic device 1201 (e.g., the electronic device 301) according to an example embodiment may include a housing 1210 (e.g., the housing 310), a display 361, and a heat source 389. The housing 1210 may include a main body 1211 (e.g., the main body 311), a thermal management chamber 1212 (e.g., the thermal management chamber 312), and an intermediate layer 313. The thermal management chamber 1212 may include a first wall 1221 (e.g., the first wall 321), a second wall 322, and a plurality of third walls 323. The first wall 1221 may include a first inner surface 1221a on which a microporous structure 330 is formed and a first outer surface 1221b in contact with the heat source 389. The second wall 322 may have a second inner surface 322a on which a hydrophobic surface body 340 is formed.

In an example embodiment, the thermal management chamber 1212 may include a junction 1224 that connects the first wall 1221 to the plurality of third walls 323 and the main body 1211. For example, the first wall 1221 may be manufactured separately from the plurality of third walls 323 and the main body 1211 and then connected to the plurality of third walls 323 and the main body 1211. A portion of the junction 1224 may connect a portion of the first wall 1221 and the plurality of third walls 323, and another portion of the junction 1224 may connect another portion of the first wall 1221 and the main body 1211. Unlike the junction 324 of the thermal management chamber 312 described above with reference to FIG. 3A, the junction 1224 may be connected to a portion (e.g., a lower part) of the main body 1211 over the plurality of third walls 323, to manufacture the thermal management chamber 1212 having a height (e.g., a distance between the first inner surface 1221a and the second inner surface 322a, e.g., about 0.3 mm) greater than a height (e.g., a distance between the first inner surface 321a and the second inner surface 322a, e.g., about 0.2 mm) of the thermal management chamber 312 of FIG. 3A, expand the inner space S of the thermal management chamber 1212, and reduce the thickness of the main body 1211.

In an example embodiment, the thermal management chamber 1212 may be detachably coupled to the main body 1211. For example, the second wall 322 and the plurality of third walls 323 may form at least a portion of the thermal management chamber 1212 without being seamlessly connected to the main body 1211. When the thermal management chamber 1212 is coupled to the main body 1211, the second wall 322 and the plurality of third walls 323 may be connected to the main body 1211.

Figure 13:
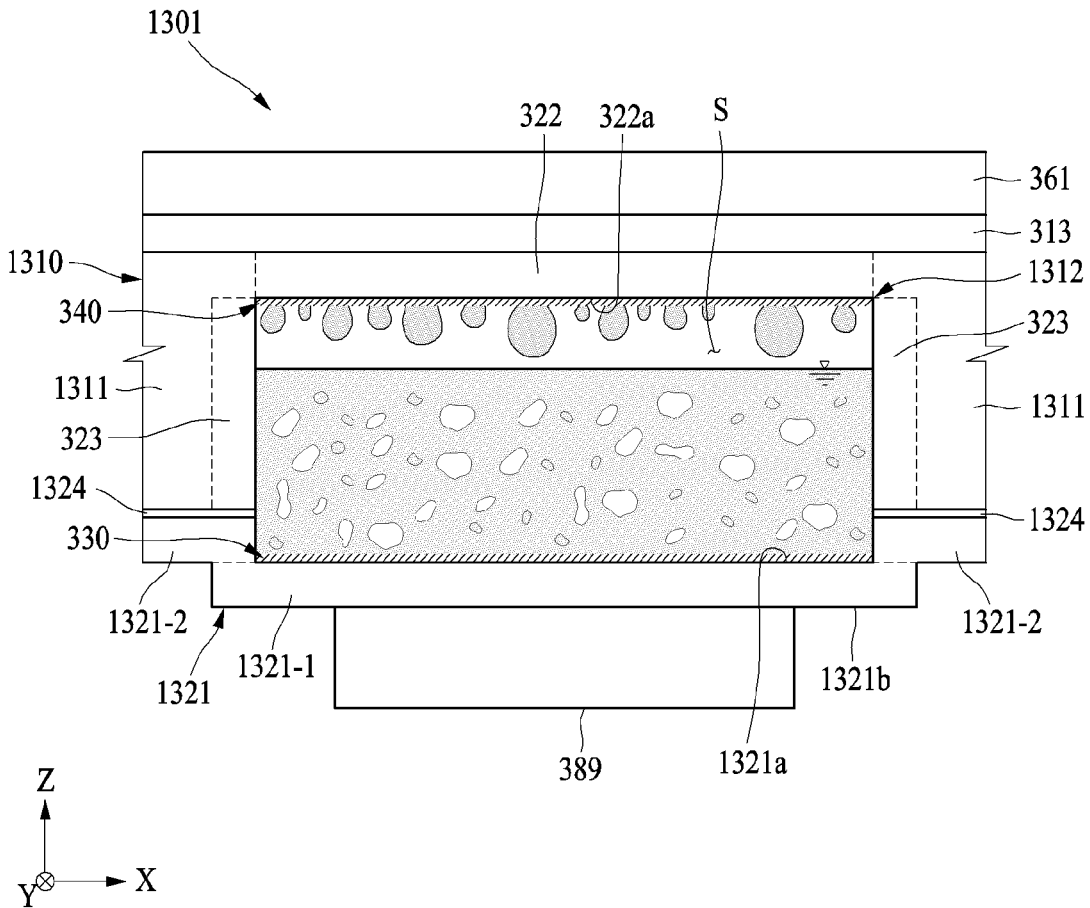
FIG. 13 is a cross-sectional view of a partial area of an electronic device (e.g., the electronic device of FIG. 3A) according to various example embodiments.

Referring to FIG. 13, an electronic device 1301 (e.g., the electronic device 301) according to an example embodiment may include a housing 1310 (e.g., the housing 310), a display 361, and a heat source 389. The housing 1310 may include a main body 1311 (e.g., the main body 311), a thermal management chamber 1312 (e.g., the thermal management chamber 312), and an intermediate layer 313. The thermal management chamber 1312 may include a first wall 1321 (e.g., the first wall 321), a second wall 322, and a plurality of third walls 323. The second wall 322 may have a second inner surface 322a on which a hydrophobic surface body 340 is formed.

In an example embodiment, the first wall 1321 may include a first part 1321-1 including a first inner surface 1321a on which a microporous structure 330 is formed and a first outer surface 1321b in contact with the heat source 389, and a second part 1321-2 connected to the first part 1321-1 and connected to the plurality of third walls 323 and the main body 1311. In an example embodiment, the first part 1321-1 and the second part 1321-2 may be seamlessly and integrally formed with each other. In an example embodiment, the first part 1321-1 may be disposed below (e.g., a −Z direction) the second part 1321-2. In an example embodiment, a step may be formed between the first part 1321-1 and the second part 1321-2. In an example embodiment, the second part 1321-2 may be connected to at least a portion of the first part 1321-1. In an example embodiment, at least a portion of the first part 1321-1 and at least a portion of the second part 1321-2 may form at least a portion of an inner space S of the thermal management chamber 1312.

In an example embodiment, the thermal management chamber 1312 may include a junction 1324 that connects the first wall 1321 to the plurality of third walls 323 and the main body 1311. For example, the first wall 1321 may be manufactured separately from the plurality of third walls 323 and the main body 1311 and then connected to the plurality of third walls 323 and the main body 1311. In an example embodiment, a portion of the junction 1324 may connect a portion of the second part 1321-2 of the first wall 1321 and the plurality of third walls 323, and another remaining portion of the junction 1324 may connect another portion of the second part 1321-2 of the first wall 1321 and the main body 1311. Unlike the junction 1224 of the thermal management chamber 1212 described above with reference to FIG. 12, the junction 1324 may be provided to manufacture the thermal management chamber 1312 having a height (e.g., a distance between the first inner surface 1321a and the second inner surface 322a, e.g., about 0.4 mm) greater than a height (e.g., a distance between the first inner surface 1221a and the second inner surface 322a, e.g., about 0.3 mm) of the thermal management chamber 1212, and expand further an inner space S of the thermal management chamber 1312 while reducing the thickness of the main body 1311.

In an example embodiment, the thermal management chamber 1312 may be detachably coupled to the main body 1311. For example, the second wall 322 and the plurality of third walls 323 may form at least a portion of the thermal management chamber 1312 without being seamlessly connected to the main body 1311. When the thermal management chamber 1312 is coupled to the main body 1311, the second wall 322 and the plurality of third walls 323 may be connected to the main body 1311.

Figure 14:
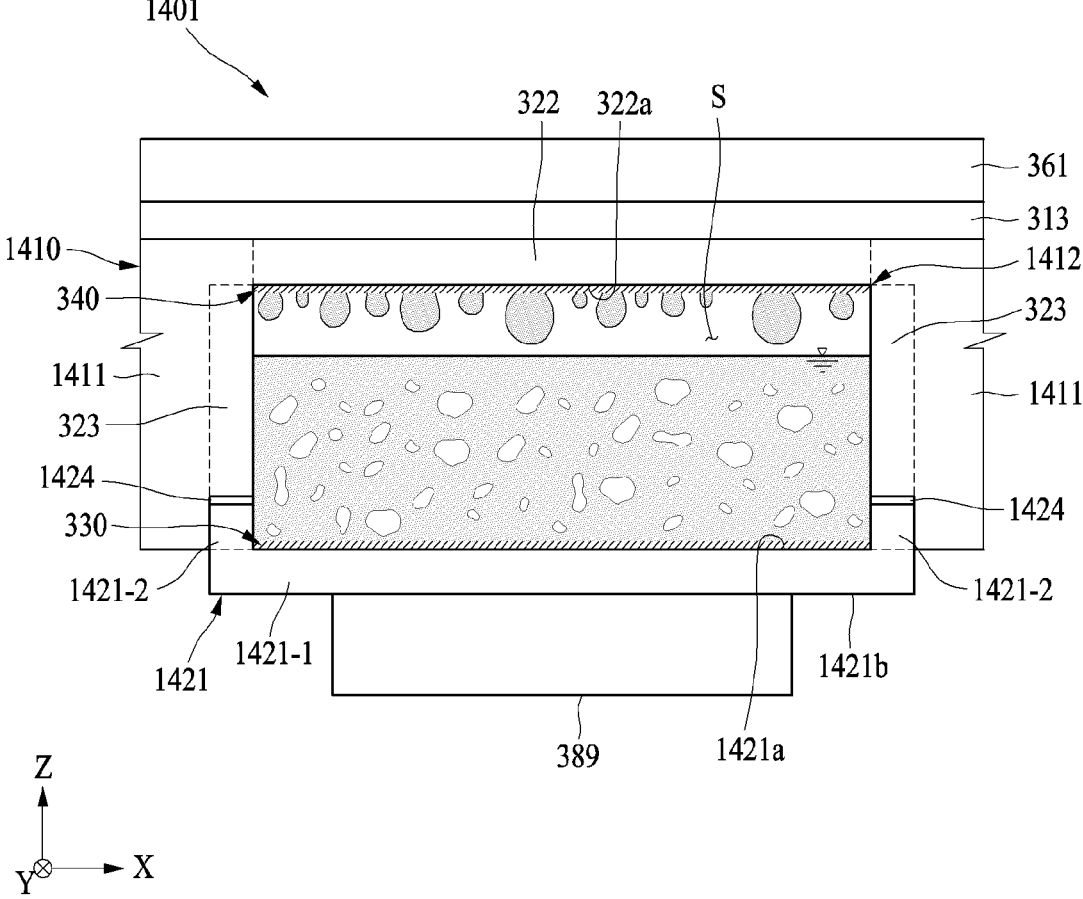
FIG. 14 is a cross-sectional view of a partial area of an electronic device (e.g., the electronic device of FIG. 3A) according to various example embodiments.

Referring to FIG. 14, an electronic device 1401 (e.g., the electronic device 301) according to an example embodiment may include a housing 1410 (e.g., the housing 310), a display 361, and a heat source 389. The housing 1410 may include a main body 1411 (e.g., the main body 311), a thermal management chamber 1412 (e.g., the thermal management chamber 312), and an intermediate layer 313. The thermal management chamber 1412 may include a first wall 1421 (e.g., the first wall 321), a second wall 322, and a plurality of third walls 323. The second wall 322 may have a second inner surface 322a on which a hydrophobic surface body 340 is formed.

In an example embodiment, the first wall 1421 may include a first part 1421-1 including a first inner surface 1421a on which a microporous structure 330 is formed and a first outer surface 1421b in contact with the heat source 389, and a second part 1421-2 connected to the first part 1421-1 and connected to the plurality of third walls 323. In an example embodiment, the first part 1421-1 and the second part 1421-2 may be seamlessly and integrally formed with each other. In an example embodiment, the first part 1421-1 may be disposed below (e.g., in a –Z direction) the second part 1421-2. In an example embodiment, the first part 1421-1 may extend in one direction (e.g., a +X/–X direction), and the second part 1421-2 may extend in another direction (e.g., a Z direction) of the first part 1421-1. In an example embodiment, the second part 1421-2 may be connected to at least a portion (e.g., an end portion) of the first part 1421-1. In an example embodiment, at least a portion of the first part 1421-1 and at least a portion of the second part 1421-2 may form at least a portion of an inner space S of the thermal management chamber 1412.

In an example embodiment, the thermal management chamber 1412 may include a junction 1424 that connects the first wall 1421 to the plurality of third walls 323. For example, the first wall 1421 may be manufactured separately from the plurality of third walls 323 and the main body 1411 and then connected to the plurality of third walls 323. In an example embodiment, the junction 1424 may connect a portion of the second part 1321-2 of the first wall 1321 and the plurality of third walls 323. In an example embodiment, the junction 1424 may form a seal between the second part 1321-2 and the plurality of third walls 323. Unlike the junction 1224 of the thermal management chamber 1212 described above with reference to FIG. 12, the junction 1424 may be provided to manufacture the thermal management chamber 1412 having a height (e.g., a distance between first inner surface 1421a and the second inner surface 322a, e.g., about 0.4 mm) greater than a height (e.g., a distance between the first inner surface 1221a and the second inner surface 322a, e.g., about 0.3 mm) of the thermal management chamber 1212, and expand further the inner space S of the thermal management chamber 1412 while reducing the thickness of the main body 1411.

In an example embodiment, the thermal management chamber 1412 may be detachably coupled to the main body 1411. For example, the second wall 322 and the plurality of third walls 323 may form at least a portion of the thermal management chamber 1412 without being seamlessly connected to the main body 1411. When the thermal management chamber 1412 is coupled to the main body 1411, the second wall 322 and the plurality of third walls 323 may be connected to the main body 1411.

Figure 15:
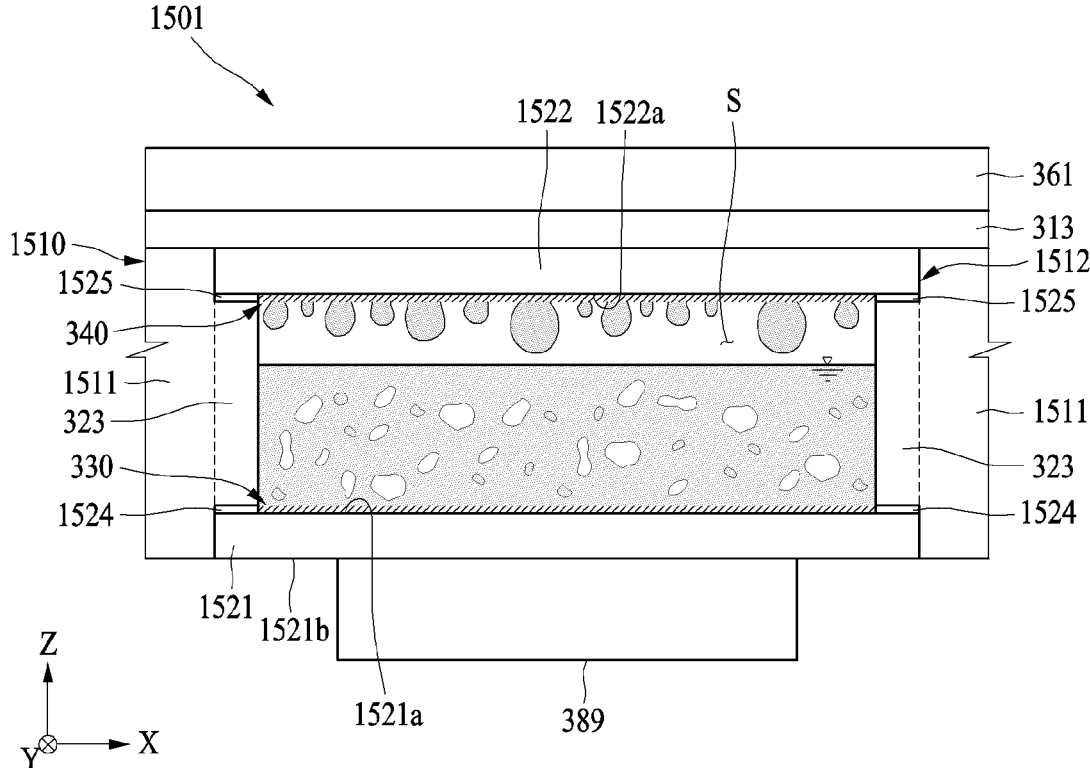
FIG. 15 is a cross-sectional view of a partial area of an electronic device (e.g., the electronic device of FIG. 3A) according to various example embodiments.

Referring to FIG. 15, an electronic device 1501 (e.g., the electronic device 301) according to an example embodiment may include a housing 1510 (e.g., the housing 310), a display 361, and a heat source 389. The housing 1510 may include a main body 1511 (e.g., the main body 311), a thermal management chamber 1512 (e.g., the thermal management chamber 312), and an intermediate layer 313. The thermal management chamber 1512 may include a first wall 1521 (e.g., the first wall 321), a second wall 1522 (e.g., the second wall 322), and a plurality of third walls 323. The first wall 1521 may have a first inner surface 1521a on which a microporous structure 330 is formed and a first outer surface 1521b in contact with the heat source 389. The second wall 1522 may have a second inner surface 1522a on which a hydrophobic surface body 340 is formed.

In an example embodiment, the thermal management chamber 1512 may include a first junction 1524 that connects the first wall 1521 to a portion of the plurality of third walls 323, and a second junction 1525 that connects the second wall 1522 to another portion of the plurality of third walls 323. For example, the first wall 1521 and the second wall 1522 may be manufactured separately from the plurality of third walls 323 and the main body 1511 and then connected to the plurality of third walls 323.

In an example embodiment, a first material forming the first wall 1521 and a second material forming the second wall 1522 may be the same. In an example embodiment, the first material and the second material may be different.

In an example embodiment, the thermal management chamber 1512 may be detachably coupled to the main body 1511. For example, the plurality of third walls 323 may form at least a portion of the thermal management chamber 1512 without being seamlessly connected to the main body 1511. When the thermal management chamber 1512 is coupled to the main body 1511, the plurality of third walls 323 may be connected to the main body 1511.

Figure 16:
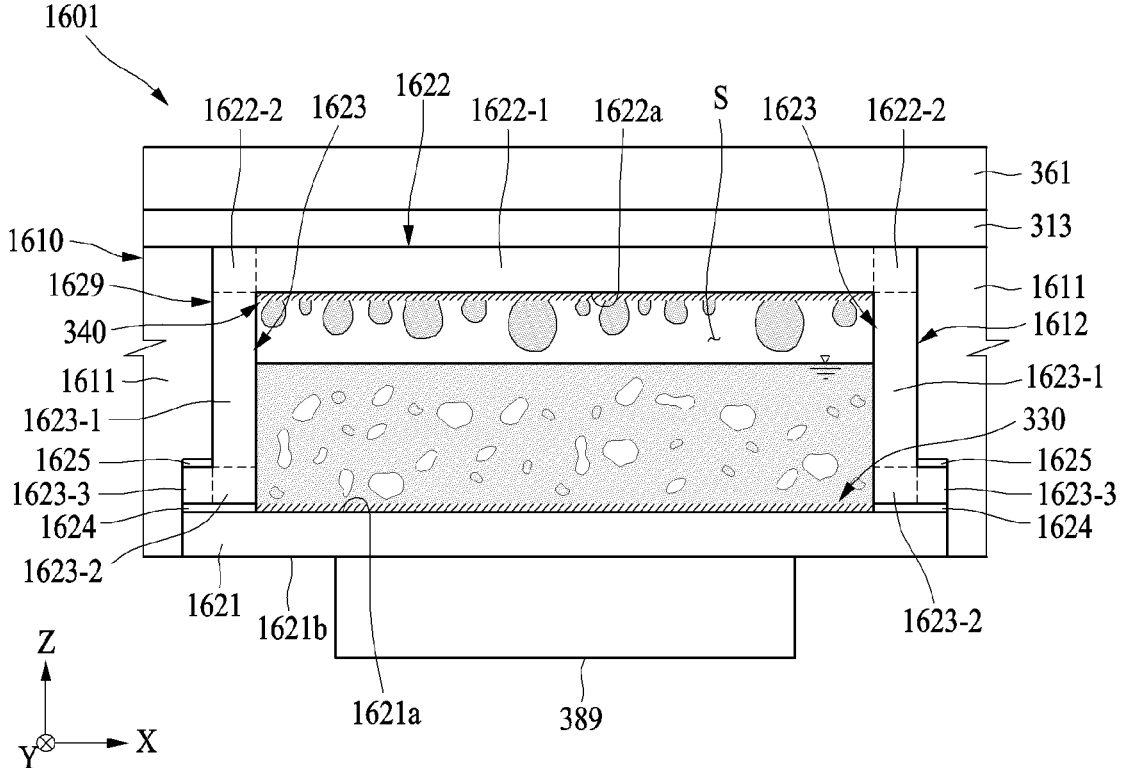
FIG. 16 is a cross-sectional view of a partial area of an electronic device (e.g., the electronic device of FIG. 3A) according to various example embodiments.

Referring to FIG. 16, an electronic device 1601 (e.g., the electronic device 301) according to an example embodiment may include a housing 1610 (e.g., the housing 310), a display 361, and a heat source 389. The housing 1610 may include a main body 1611 (e.g., the main body 311), a thermal management chamber 1612 (e.g., the thermal management chamber 312), and an intermediate layer 313. The thermal management chamber 1612 may include a first wall 1621 (e.g., the first wall 321), a second wall 1622 (e.g., the second wall 322), and a plurality of third walls 1623 (e.g., the third walls 323). The first wall 1621 may have a first inner surface 1621*a* on which a microporous structure 330 is formed and a first outer surface 1621*b* in contact with the heat source 389.

In an example embodiment, the second wall 1622 and the plurality of third walls 1623 may be seamlessly and integrally formed to form a single wall 1629 that defines at least a portion of the thermal management chamber 1612. The second wall 1622 may include a first part 1622-1 and a second part 1622-2, and the plurality of third walls 1623 may include a third part 1623-1, a fourth part 1623-2, and a fifth part 1623-3, respectively. The first part 1622-1 may have a second inner surface 1622*a* on which a hydrophobic surface body 340 is formed. The second part 1622-2 may be seamlessly connected to the first part 1622-1 and the third part 1623-1. The third part 1623-1 and the fourth part 1623-2 may extend between the second part 1622-2 and the first wall 1621 in one direction (e.g., a height direction, a Z direction) of the thermal management chamber 1612, and may form at least a portion of an inner space S of the thermal management chamber 1612. The fourth part 1623-2 may be connected to the first wall 1621. The fifth part 1623-3 may extend between at least a portion of the first wall 1621 and at least a portion of the main body 1611 from the fourth part 1623-2 in a direction (e.g., a +X/−X direction) receding from the thermal management chamber 1612, and may be connected to the at least a portion of the first wall 1621 and the at least a portion of the main body 1611. The third part 1623-1, the fourth part 1623-2, and the fifth part 1623-3 may be formed seamlessly.

In an example embodiment, the thermal management chamber 1612 may include a first junction 1624 that connects at least a portion of the first wall 1621 to one side of the fourth part 1623-2 and the fifth part 1623-3 of the plurality of third walls 1623, and a second junction 1625 that connects the other side of the fifth part 1623-3 of the third walls 1623 to the main body 1611. For example, after the first wall 1621 may be manufactured separately from the main body 1611 and the second wall 1622 and the plurality of third walls 1623 may be manufactured as a single component separately from the main body 1611, the first wall 1621 and the plurality of third walls 1623 may be connected and the plurality of third walls 1623 may be connected to the main body 1611.

In an example embodiment, a second material forming the second wall 1622 and a third material forming the plurality of third walls 1623 may be the same. In an example embodiment, a first material forming the first wall 1621 may be the same as or similar to the second material and the third material. In an example embodiment, the first material may be different from the second material and the third material.

In an example embodiment, the thermal management chamber 1612 may be detachably coupled to the main body 1611. For example, the first wall 1621, the second wall 1622, and the plurality of third walls 1623 may form at least a portion of the thermal management chamber 1612 without being seamlessly connected to the main body 1611. When the thermal management chamber 1612 is coupled to the main body 1611, the first wall 1621, the second wall 1622, and the plurality of third walls 1623 may be connected to the main body 1611.

According to various example embodiments, an electronic device may include: a housing including a heat source and a thermal management chamber thermally coupled to the heat source; and a display disposed on the housing opposite the heat source. The thermal management chamber may contain a working fluid, and the thermal management chamber may be configured to generate bubbles in the working fluid at or above a critical boiling temperature of the working fluid. The thermal management chamber may include a first wall disposed adjacent the heat source and having a hydrophilic first inner surface, a second wall disposed opposite the first wall spaced apart from the heat source and having a hydrophobic second inner surface, and a plurality of third walls disposed between the first wall and the second wall.

In an example embodiment, the first wall may include a microporous structure formed on the first inner surface.

In an example embodiment, the microporous structure may include a sintered metal powder coating.

In an example embodiment, a size of an area of the sintered metal powder coating with respect to a size of an area of the first inner surface may be ⅓ or greater.

In an example embodiment, the microporous structure may include a plurality of pillars protruding from the first inner surface, and a pair of adjacent pillars of the plurality of pillars may form a flow channel of the working fluid.

In an example embodiment, the plurality of pillars may include a plurality of pillars of a first group arranged along a first direction of the first inner surface, and a plurality of pillars of a second group arranged along a second direction crossing the first direction of the first inner surface.

In an example embodiment, the microporous structure may include a plurality of first ribs spaced apart from each other along the first direction of the first inner surface and protruding from the first inner surface, and the plurality of first ribs may extend along the second direction crossing the first direction of the first inner surface.

In an example embodiment, the microporous structure may include at least one second rib extending along the first direction of the first inner surface and protruding from the first inner surface to meet the plurality of first ribs.

In an example embodiment, the microporous structure may include a plurality of dimples recessed in the first inner surface.

In an example embodiment, the microporous structure may include a plurality of holes formed in the first inner surface.

In an example embodiment, the thermal management chamber may further include reinforcing ribs formed on the second wall.

In an example embodiment, the working fluid may fill at least 70% of a space of the thermal management chamber formed by the first wall, the second wall, and the plurality of third walls.

In an example embodiment, the thermal management chamber may include a first junction disposed between the first wall and the plurality of third walls and connecting the first wall and the plurality of third walls.

In an example embodiment, the thermal management chamber may further include a second junction disposed between the second wall and the plurality of third walls and connecting the second wall and the plurality of third walls.

In an example embodiment, the second wall and the plurality of third walls may be seamlessly connected.

In an example embodiment, the first wall or the second wall may comprise the same material as the plurality of third walls.

In an example embodiment, the first wall or the second wall may comprise a material different from a material of the plurality of third walls, and the material of the first wall or the second wall may have a thermal resistance less than a thermal resistance of the material of the plurality of third walls.

In an example embodiment, the housing may further include a main body supporting the display, and the second wall and the plurality of third walls may be seamlessly formed with the main body. The housing may further include a first junction connecting the first wall and the plurality of third walls.

According to various example embodiments, an electronic device may include: a housing including a main body, a heat source, and a thermal management chamber thermally coupled to the heat source and detachably coupled to the main body; and a display disposed on the main body opposite the heat source. The thermal management chamber may include a first wall disposed adjacent the heat source and having a hydrophilic first surface, a second wall disposed opposite the first wall spaced apart from the heat source and having a hydrophobic second surface, and a plurality of third walls disposed between the first wall and the second wall. The plurality of third walls may be seamlessly formed with the main body, and the housing may further include a first junction connecting the first wall and the plurality of third walls.

In an example embodiment, the housing may further include a second junction connecting the second wall and the plurality of third walls.

According to various example embodiments, an electronic device may include: a housing including a main body, a heat source, and a thermal management chamber thermally coupled to the heat source and detachably coupled to the main body; and a display disposed on the main body opposite the heat source. The thermal management chamber may include a first wall disposed adjacent the heat source and having a hydrophilic first surface, a second wall disposed opposite the first wall spaced apart from the heat source and having a hydrophobic second surface, and a plurality of third walls disposed between the first wall and the second wall. The second wall and the plurality of third walls may be seamlessly formed, and the housing may further include a first junction connecting the first wall and at least a portion of the plurality of third walls, and a second junction connecting the main body and at least a portion of the plurality of third walls.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device, comprising:
a housing comprising a heat source and a thermal management chamber thermally coupled to the heat source; and a display disposed on the housing opposite the heat source, wherein the thermal management chamber comprises a working fluid, and wherein the thermal management chamber comprises:

a first wall disposed adjacent to the heat source and having a hydrophilic first surface;

a second wall disposed opposite the first wall spaced apart from the heat source and having a hydrophobic second surface; and a plurality of third walls disposed between the first wall and the second wall, wherein the first wall or the second wall is formed of a material different from a material of the plurality of third walls, and a thermal resistance of the material of the first wall or the second wall is less than a thermal resistance of the material of the plurality of third walls.

2. The electronic device of claim 1, wherein the first wall comprises a microporous structure formed on the first surface.

3. The electronic device of claim 2, wherein the microporous structure comprises a sintered metal powder coating.

4. The electronic device of claim 3, wherein a size of an area of the sintered metal powder coating is greater than or equal to ⅓ of a size of an area of the first surface.

5. The electronic device of claim 2, wherein the microporous structure comprises a plurality of pillars protruding from the first surface, wherein a pair of adjacent pillars among the plurality of pillars forms a flow channel of the working fluid.

6. The electronic device of claim 5, wherein the plurality of pillars comprises:

a plurality of pillars of a first group arranged along a first direction of the first surface; and a plurality of pillars of a second group arranged along a second direction crossing the first direction of the first surface.

7. The electronic device of claim 2, wherein the microporous structure comprises a plurality of first ribs spaced apart from each other along a first direction of the first surface and protruding from the first surface, wherein the plurality of first ribs extends along a second direction crossing the first direction of the first surface.

8. The electronic device of claim 7, wherein the microporous structure comprises at least one second rib extending along the first direction of the first surface and protruding from the first surface to meet the plurality of first ribs.

9. The electronic device of claim 2, wherein the microporous structure comprises a plurality of dimples recessed in the first surface.

10. The electronic device of claim 2, wherein the microporous structure comprises a plurality of holes formed in the first surface.

11. The electronic device of claim 1, wherein the thermal management chamber further comprises a reinforcing rib formed on the second wall.

12. The electronic device of claim 1, wherein the working fluid fills at least 70% of a space of the thermal management chamber formed by the first wall, the second wall, and the plurality of third walls.

13. The electronic device of claim 1, wherein the thermal management chamber further comprises a first junction disposed between the first wall and the plurality of third walls and connecting the first wall and the plurality of third walls.

14. The electronic device of claim 13, wherein the thermal management chamber further comprises a second junction disposed between the second wall and the plurality of third walls connecting the second wall and the plurality of third walls.

15. The electronic device of claim 1, wherein the second wall and the plurality of third walls are seamlessly connected to each other.

16. The electronic device of claim 1, wherein the first wall or the second wall is formed of the same material as the plurality of third walls.

17. The electronic device of claim 1, wherein the housing further comprises a main body supporting the display, and
    wherein the thermal management chamber is seamlessly and integrally formed with the main body.

18. The electronic device of claim 1, wherein the housing further comprises a main body supporting the display, and
    wherein the thermal management chamber is detachably coupled to the main body.

19. An electronic device, comprising:
    a housing comprising a heat source and a thermal management chamber thermally coupled to the heat source; and a display disposed on the housing opposite the heat source,
wherein the thermal management chamber comprises a working fluid, and
wherein the thermal management chamber comprises:
    a first wall disposed adjacent to the heat source and having a hydrophilic first surface;
    a second wall disposed opposite the first wall spaced apart from the heat source and having a hydrophobic second surface; and
    a plurality of third walls disposed between the first wall and the second wall,
wherein the housing further comprises a main body supporting the display,
wherein the second wall and the plurality of third walls are formed seamlessly with the main body, and
wherein the housing further comprises a first junction connecting the first wall and the plurality of third walls.

\*   \*   \*   \*   \*